(12) United States Patent
Tanaka et al.

(10) Patent No.: US 7,467,339 B2
(45) Date of Patent: Dec. 16, 2008

(54) SEMICONDUCTOR INTEGRATED CIRCUIT AND A METHOD OF TESTING THE SAME

(75) Inventors: Toshihiro Tanaka, Akiruno (JP); Yutaka Shinagawa, Iruma (JP); Masahiko Kimura, Kodaira (JP); Isao Nakamura, Fussa (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 11/329,229

(22) Filed: Jan. 11, 2006

(65) Prior Publication Data

US 2006/0123299 A1 Jun. 8, 2006

Related U.S. Application Data

(63) Continuation of application No. 10/083,399, filed on Feb. 27, 2002, now Pat. No. 7,000,160.

(30) Foreign Application Priority Data

Apr. 24, 2001 (JP) ............................. 2001-125275

(51) Int. Cl.
*G01R 31/28* (2006.01)
*G06F 11/00* (2006.01)

(52) U.S. Cl. ..................... 714/724; 714/736; 714/738

(58) Field of Classification Search ................ 714/718, 714/736, 738, 819, 799, 22, 700, 724, 740; 365/226, 185.18
See application file for complete search history.

(56) References Cited

U.S. PATENT DOCUMENTS

| | | | | |
|---|---|---|---|---|
| 5,261,082 A | 11/1993 | Ito et al. | ..................... | 713/501 |
| 5,432,501 A * | 7/1995 | Yoon | ........................ | 340/650 |
| 5,583,485 A * | 12/1996 | Van Lente et al. | ........... | 340/525 |
| 5,760,599 A | 6/1998 | Ehiro | ........................ | 324/765 |
| 5,886,657 A | 3/1999 | Ahuja | ........................ | 341/144 |
| 6,114,920 A | 9/2000 | Moon et al. | ................. | 331/179 |
| 6,437,833 B1 * | 8/2002 | Tagomori et al. | ........... | 348/657 |
| 6,529,247 B2 | 3/2003 | Tagomori et al. | ........... | 348/657 |
| 6,795,353 B2 * | 9/2004 | Matsuda et al. | ............. | 365/191 |
| 6,819,596 B2 | 11/2004 | Ikehashi et al. | ........ | 365/185.22 |
| 7,236,419 B2 * | 6/2007 | Ishikawa et al. | ............ | 365/226 |
| 2002/0149701 A1 * | 10/2002 | Tagomori et al. | ........... | 348/655 |
| 2004/0042331 A1 | 3/2004 | Ikehashi et al. | ............. | 365/232 |

FOREIGN PATENT DOCUMENTS

JP  5-265579  10/1993

* cited by examiner

*Primary Examiner*—Phung M Chung
(74) *Attorney, Agent, or Firm*—Miles & Stockbridge P.C.

(57) ABSTRACT

A semiconductor integrated circuit (LSI) in which control information for determining a voltage or a width of a pulse produced itself can easily be set in parallel with other LSIs, and set information can be corrected easily. From an external evaluation device, a voltage of an expected value is supplied in overlapping manner to a plurality of LSIs each having a CPU and a flash memory. Each LSI incorporates a comparison circuit comparing an expected voltage value and a boosted voltage generated in itself. The CPU refers to a comparison result and optimizes control data in a data register for changing a boosted voltage. The CPU controls the comparison circuit and the data register and performs trimming in a self-completion manner, thereby making, trimming on a plurality of LSIs easily in a parallel manner and a total test time reduced.

7 Claims, 29 Drawing Sheets

FIG. 20

| RING OSCILLATOR FREQUENCY | TRIMMING | | |
|---|---|---|---|
| | TRIMMING REGISTER | DIVISION RATIO | FREQUENCY (φ/n) AFTER TRIMMING |
| 64MHz | (0,0,0) | 1/64 | 64/64=1.0MHz |
| 60MHz | (0,0,1) | 1/60 | 60/60=1.0MHz |
| 56MHz | (0,1,0) | 1/56 | 56/56=1.0MHz |
| 52MHz | (0,1,1) | 1/52 | 52/52=1.0MHz |
| 48MHz | (1,0,0) | 1/48 | 48/48=1.0MHz |
| 44MHz | (1,0,1) | 1/44 | 44/44=1.0MHz |
| 40MHz | (1,1,0) | 1/40 | 40/40=1.0MHz |
| 36MHz | (1,1,1) | 1/36 | 36/36=1.0MHz |

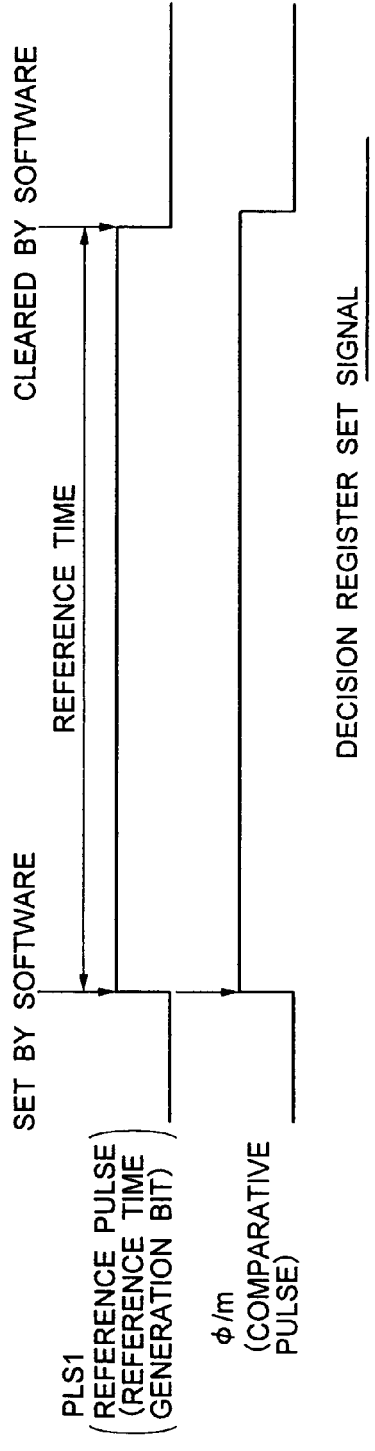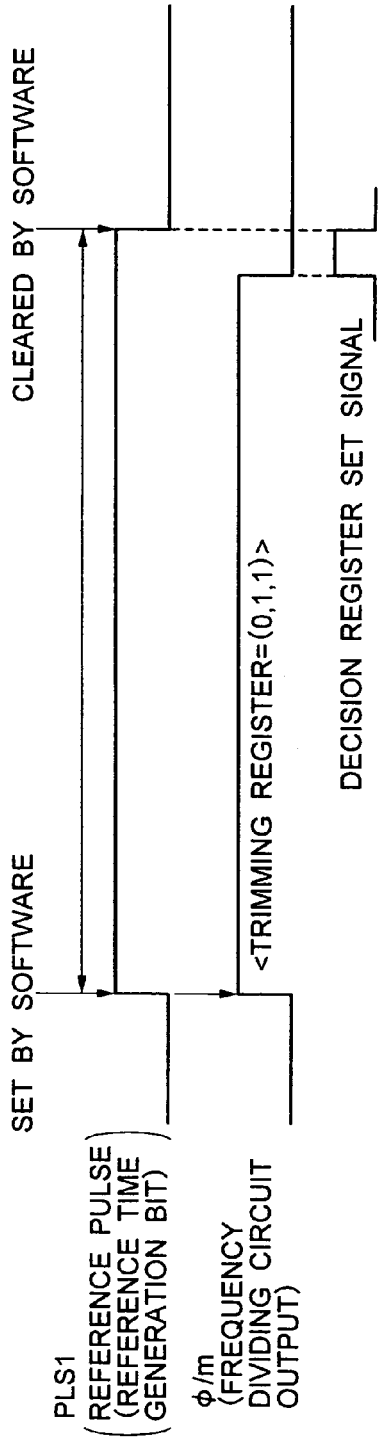

SEMICONDUCTOR INTEGRATED CIRCUIT AND A METHOD OF TESTING THE SAME

CROSS-REFERENCE TO RELATED APPLICATION

The application is a continuation of application Ser. No. 10/083,399 filed Feb. 27, 2002 now U.S. Pat. No. 7,000,160.

BACKGROUND OF THE INVENTION

The present invention relates to a trimming technique for finely adjusting a voltage, the width of a pulse, etc., produced in a semiconductor integrated circuit (large-scale integrated circuit (LSI)) in accordance with characteristics of LSI, and relates to a semiconductor integrated circuit such as a microcomputer incorporating a flash memory and to a testing method of performing trimming on such a semiconductor integrated circuit.

There are some nonvolatile memories such as flash memories generating a particular programming voltage in LSIs. This voltage varies because of manufacturing variation and there is a need to perform trimming or fine adjustment for correcting the programming voltage in each LSI. The memory programming time characteristic also varies. Therefore, the programming voltage is changed according to the memory characteristics to constantly maintain memory programming characteristics.

In fine adjustment (hereinafter referred to as "voltage trimming") of a programming voltage (e.g., an internal boosted voltage) generated in such a nonvolatile memory, the voltage generated in the LSI is measured with an external evaluation device (tester or the like). Therefore, parallel trimming cannot be performed on a plurality of such memory LSIs. For example, it is difficult to use a parallel testing method in which a program for testing flash memories incorporated in microcomputers is transferred to internal random access memories (RAMs) and parallel executions of the program are carried out by the internal central processing units (CPUs) provided in each of the microprocessors. For this reason, a sequential method in which trimming is performed on one LSI at a time to adjust an internal boosted voltage or the like has been practiced, requiring an increased test time. A tester having the function of performing parallel measurement on a plurality of LSIs is considerably high-priced and it is not practical to use such a high-priced tester only for voltage trimming or the like.

Some flash memories or microcomputers incorporating flash memories require use of a trimming technique with respect to the width of write pulses for setting the write voltage application time to a specified value or with respect to the current through a MOST transistor as well as use of a trimming technique for voltage trimming. Use of a trimming technique in such a case also entails the same consideration as that described above since there is also a need to separately measure the object of measurement.

JP-A-5-265579 describes an example of prior art containing a description of voltage trimming. This document relates to a method of performing trimming for adjustment of a reference voltage in such a manner that a series from which a trimmed value is obtained is generated while a counter is being incremented, and the trimmed value is written to a programmable read only memory (PROM) circuit when a reference voltage output coincides with a target value. The counter and a circuit for incrementing the counter are provided in the form of hardware and the PROM circuit has a fuse configuration. According to this document, an on-chip comparator or a comparator on a tester may be used as a comparator for comparison between the voltage obtained by trimming and the target voltage value.

SUMMARY OF THE INVENTION

In JP-A-5-265579, use of an on-chip comparator or a comparator on a tester as a comparator for comparison between the voltage obtained by trimming and the target voltage value is simply stated but no notice is taken of the difference between the two cases. In contrast, the inventors of the present invention took note of the following points. That is, trimming on a plurality of LSIs with one evaluation device is effective in reducing the time required for testing including a measuring operation for voltage trimming or the like, but this voltage trimming cannot be performed in a parallel manner because the external evaluation device measures the voltage. Only a limited effect may be obtained by performing voltage measurement and trimming register value adjustment while successively changing the objects by switching with a relay. The same can be said with respect to trimming for adjustment of the write pulse width and the erase pulse width determined by dividing a clock frequency generated from an internal oscillator, or the current through a MOS transistor determined by LSI manufacturing conditions. Thus, any process in which LSIs undergoes trimming one after another requires a considerably long test time.

The technique disclosed in JP-A-5-265579 has no means for changing the trimmed value since it uses a counter in hardware form and a fuse. In the case of an application to trimming for adjustment of a boosted voltage, however, a need arises to correct the trimmed value after adjustment of the voltage value, for example, if a write time target value is not reached.

An object of the present invention is to provide a semiconductor integrated circuit capable of setting control information for determining a voltage or a pulse width in a self-completion manner and also capable of easily correcting the control information.

Another object of the present invention is to provide a semiconductor integrated circuit testing method in which control information for determining a voltage or a pulse width can be set with facility in overlapping manner and can easily be corrected.

[1] The present invention will be outlined below with respect to its typical aspects.

For example, to test a plurality of semiconductor integrated circuits each including a CPU and a flash memory, a voltage is supplied as an expected voltage to the semiconductor integrated circuits in a parallel manner from an evaluation device outside the semiconductor integrated circuits. Accordingly, each semiconductor integrated circuit incorporates a decision circuit which compares the expected voltage value and a boosted (step-down) voltage generated in the integrated circuit. The semiconductor integrated circuit also has a register for storing the result of comparison made by the decision circuit, and has a system capable of making a decision about the comparison result by means of a control circuit such as an internal CPU. For example, a data register (trimming register) for changing a boosted (step-down) voltage value is incorporated and an internal CPU enables to rewrite the value in the trimming register. The internal CPU controls the comparator and the register to perform trimming in a self-completion manner. A self-trimming program transferred to memories (e.g., RAMs) in a plurality of memory LSIs arranged as described above can be executed in a parallel manner. In this program, a value is set in the trimming register, determination of the result of comparison made by the voltage decision circuit is awaited, and a decision is made about the value in the trimming register representing the comparison result. According to the decision result, the value in the trimming register is updated. These steps are repeated until the voltage generated in the circuit becomes equal to the expected voltage value input from the evaluation device outside the LSIs, or until the desired condition is attained. The value in the trimming register when the expected value is reached is stored as a trimmed value. This storage may be realized by writing the information in a trimming area of the flash memory, for example.

Similarly, with respect to the current through a MOS transistor in a plurality of LSIs, current trimming may be performed by externally applying a reference current simultaneously to the plurality of LSIs and by comparing the reference current and the current through the internal MOS transistor in each LSI. To externally supply a constant current to the plurality of LSIs in a parallel manner, a method may be used in which a constant resistor is connected to an input terminal of each LSI and a constant voltage is applied to the resistor to produce the constant current.

Also, with respect to a control clock for producing a write pulse width and an erase pulse width, trimming for adjustment of the frequency of the control clock may be performed by comparing a reference time and a time generated in an internal oscillator. The reference time may be internally produced on the basis of a clock of a particular frequency externally supplied at the time of testing or may be directly supplied externally as a reference pulse.

As described above, a trimmed value which coincides with a voltage or a current of an expected value can be obtained by only supplying the expected voltage or current value externally and executing a trimming program by means of an internal CPU. The same effect is also ensured with respect to trimming for adjustment of the frequency of a control clock for generating write and erase pulses. A voltage, a current or a pulse of an expected value externally provided can be supplied in common to a plurality of LSIs. Since a trimming program is executed by means of an internal CPU, it can be executed in the plurality of LSIs in a parallel manner. Thus, parallel trimming can be performed on a plurality of LSIs with facility and the total test time can be reduced. Also, there is no need to provide a switching device such as a relay in the evaluation device.

[2] The present invention will be described in more detail with respect to its several aspects. According to a first aspect of the present invention, a semiconductor integrated circuit such as a data processor including a CPU and a flash memory or the like as on-chip components may be provided.

<<Data Processor>>

The semiconductor integrated circuit includes, on one semiconductor substrate, voltage generation means capable of generating a voltage on the basis of control data loaded into a data register, nonvolatile storage means in which the control data is held, and a processing circuit used to prepare the control data held in the nonvolatile storage means. The processing circuit includes a decision circuit which determines the relationship between a reference voltage supplied from the outside of the semiconductor substrate and the voltage generated by the voltage generation means, and a control circuit which determines the control data on the data register with reference to an output from the decision circuit, and which stores the determined control data in the nonvolatile storage means by reading out the data from the data register. The operation of the control circuit is determined by a program.

The decision circuit which determines the relationship between a reference voltage supplied from the outside of the semiconductor substrate and the voltage generated by the voltage generation means may have a configuration for directly comparing the reference voltage and the voltage generated by the voltage generation means, or configuration for comparing the reference voltage and a voltage on a path where the current is controlled according to the voltage generated by the voltage generation means. The former configuration is most suitable for voltage trimming, and the latter configuration is most suitable for current trimming.

Since the semiconductor integrated circuit incorporates the decision circuit, trimming processing in a plurality of the semiconductor integrated circuits connected to an evaluation device such as a tester can be performed in a parallel manner. Also, since the semiconductor integrated circuit has the data register, the decision circuit and the control circuit, trimming can be performed in a self-completion manner in the semiconductor integrated circuit. A certain program may be executed in the control circuit to enable control information to be corrected with facility even after the completion of setting of the control information.

<<Initial Loading of Control Data>>

The control circuit can perform, in response to a first operation mode such as a test mode, processing for determining control data on the data register with reference to the output from the decision circuit and storing the determined control data in the nonvolatile storage means by reading out the data from the data register, and can perform, in response to a second operation mode such as a reset operation or reset instruction cancellation, processing for loading the control data from the nonvolatile storage means into the data register.

<<CPU>>

The above-described control circuit is, for example, a central processing unit. A RAM accessible by the central processing unit may be provided. The central processing unit executes a program held in a predetermined area of the RAM in response to the first operation mode.

The central processing unit also executes, in response to the second mode, processing for loading the control data from the nonvolatile storage means to the data register.

<<Boosting>>

The voltage generation circuit may be a boosting circuit which boosts a power supply voltage externally supplied. In such a case, the nonvolatile storage means may be a flash memory. The voltage generation means can supply a high voltage for erase and write on the flash memory.

[3] According to a second aspect of the present invention, a semiconductor integrated circuit such as a discrete flash memory may be provided.

<<Flash Memory>>

The semiconductor integrated circuit has, on one semiconductor substrate, a plurality of nonvolatile storage elements electrically erasable and writable, voltage generation means capable of generating a high voltage for erase and write on the plurality of nonvolatile storage elements on the basis of control data loaded into a data register from one of the plurality of storage elements, and a processing circuit used to prepare the control data held in the one nonvolatile storage element. The processing circuit includes a decision circuit which determines the relationship between a reference voltage supplied from the outside of the semiconductor substrate and the voltage generated by the voltage generation means, and a control circuit which determines the control data with reference to an output from the decision circuit. The operation of the control circuit is determined by a program.

<<Initial Loading of Control Data>>

The control circuit can perform, in response to a first operation mode, processing for determining control data on the data register with reference to the output from the decision circuit and storing the determined control data in the one nonvolatile storage element by reading out the data from the data register, and can perform, in response to a second operation mode, processing for loading the control data from the one nonvolatile storage element into the data register.

For example, the voltage generation circuit is a boosting circuit which boosts a power supply voltage externally supplied. In this case, the nonvolatile storage means is a flash memory element. The voltage generation means can supply a high voltage for erase and write on the flash memory element.

[4] According to a third aspect of the present invention, a semiconductor integrated circuit in which pulse width trimming is performed may be provided. The semiconductor integrated circuit has, on one semiconductor substrate, a clock generation circuit which outputs a clock signal having a signal cycle according to control data loaded into a data register, nonvolatile storage means in which the control data is held, and a processing circuit used to prepare the control data held in the nonvolatile storage means. The processing circuit includes a decision circuit which determines the relationship between the pulse width of a reference pulse signal and the pulse width of the clock signal generated by the clock generation circuit, and a control circuit which determines the control data on the data register with reference to an output from the decision circuit. The operation of the control circuit is determined by a program. For example, the clock generation circuit may be constituted by an oscillation circuit, and a frequency dividing circuit which divides the frequency of an oscillation signal output from the oscillation circuit on the basis of the control data loaded into the data register.

The control circuit stores the determined control data in the nonvolatile storage means. At this time, the control circuit performs, in response to a first operation mode, processing for determining the control data with reference to the output from the decision circuit and storing the determined control data in the nonvolatile storage means, and performs, in response to a second operation mode, processing for loading the control data from the nonvolatile storage means into the data register.

The control circuit comprises a central processing unit. For example, a RAM accessible by the central processing unit is provided and the central processing unit executes, in response to the first operation mode, a program held in a predetermined area of the above described RAM. An output signal from the frequency dividing circuit is a write control clock signal, the nonvolatile storage means comprises a flash memory, and the write control clock signal determines the pulse width of a write pulse for write to the flash memory.

[5] In a testing method in accordance with the present invention, trimming processing is performed on a plurality of semiconductor integrated circuits in a parallel manner.

The first aspect is a voltage trimming. That is, a method of testing plurality of semiconductor integrated circuits in a parallel manner, each semiconductor integrated circuit having, on one semiconductor substrate, voltage generation means capable of generating a voltage on the basis of control data loaded into a data register, nonvolatile storage means in which the control data is held, a processing circuit used to prepare the control data held in the nonvolatile storage means, comprises first processing including inputting a reference voltage to the plurality of semiconductor integrated circuits from the outside in a parallel manner, and second processing including, in execution of a test operation by means of the processing circuit of each semiconductor integrated circuit, determining the relationship between the voltage generated by the voltage generation means and the reference voltage on the basis of control data set in the data register, updating the control data until a target condition is reached by the determination result, and storing the control data in the nonvolatile storage means when the target condition is reached by the determination result. This method makes it possible easily set control information for determining a voltage, a pulse width, etc., in a plurality of semiconductor integrated circuits in a parallel manner.

The method further comprises third processing including loading a test program into each semiconductor integrated circuit, and the second processing includes processing for making the above-mentioned determination by using a decision circuit in the processing circuit, and processing for making a central processing unit in the processing circuit execute the test program to update the control data and to store the control data in the nonvolatile storage means.

The voltage generation means comprises a boosting circuit which boosts a power supply voltage externally supplied. The nonvolatile storage means comprises a flash memory, and the voltage generation means is capable of supplying a high voltage for erase and write on the flash memory.

The second aspect is a pulse width trimming. A method of testing a plurality of semiconductor integrated circuits in a parallel manner, each semiconductor integrated circuit having, on one semiconductor substrate, an oscillation circuit, a frequency dividing circuit which controls the ration of division of the frequency of an oscillation signal output from the oscillation circuit on the basis of the control data loaded into a data register, nonvolatile storage means in which the control data is stored, and processing circuit used to prepare the control data held in the nonvolatile storage means, comprises first processing including instructing each of the plurality of semiconductor integrated circuits to execute a test operation, and second processing including, in execution of the test operation by means of the processing circuit of each semiconductor integrated circuit, determining the relationship between the pulse width of a periodic signal generated by the frequency dividing circuit and the pulse width of a reference pulse signal on the basis of the control data set in the data register, updating the control data until a target condition is reached by the determination result, and storing the control data in the nonvolatile storage means when the target condition is reached by the determination result. For example, the method further comprises third processing including loading a test program into each of the semiconductor integrated circuits, and the second processing includes processing for making the above-mentioned determination by using a decision circuit in the processing circuit, and processing for making a central processing unit in the processing circuit execute the test program to update the control data and to store the control data in the nonvolatile storage means.

These and other objects, features and advantages of the present invention will become apparent from the following detailed description of embodiments of the invention in conjunction with the accompanying drawings.

BRIEF DESCRIPTION OF THE DRAWINGS

FIG. 20 is a diagram showing an example of the relationship between a set value in the division ratio trimming register and the division ratio determined by the set value;

FIGS. 21A and 21B are timing charts showing an example of the relationship between a reference pulse set to a specified value by using a reference time generation bit and the pulse width of a reference pulse $\phi/m$;

DETAILED DESCRIPTION OF THE EMBODIMENTS

<<Microcomputer>>

Figure 1:
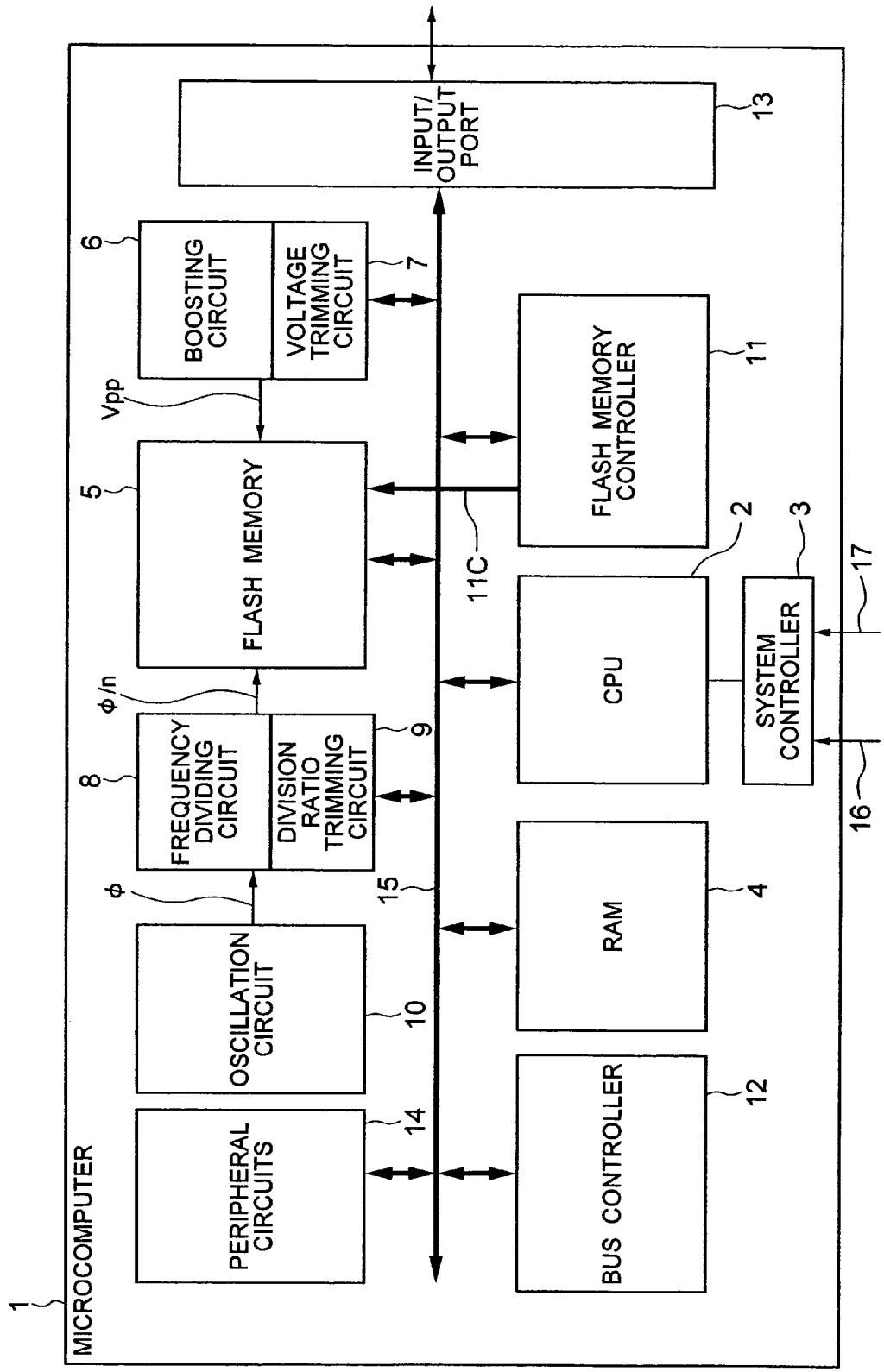
FIG. 1 is a block diagram showing a microcomputer as an example of a semiconductor integrated circuit in accordance with the present invention.

FIG. 1 illustrates a microcomputer 1 arranged as a data processor, which is an example of a semiconductor integrated circuit in accordance with the present invention. The microcomputer 1 shown in FIG. 1 is fabricated on one semiconductor substrate (semiconductor chip) such as a monocrystal silicon substrate by a well-known CMOS integrated circuit manufacturing technique, for example. As illustrated, the microcomputer 1 has a CPU 2 provided as a computation control circuit or a control circuit, a system controller 3, a RAM 4, which is a volatile memory, a flash memory 5, which is a nonvolatile memory, a boosting circuit 6, a voltage trimming circuit 7, a frequency divider circuit 8, a division ratio trimming circuit 9, an oscillator 10, a flash memory controller 11, a bus controller 12, an input/output port 13, and other peripheral circuits 14 including a timer. These circuit modules are connected to a bus 15, which includes an address bus, a data bus, and a control bus. The bus 15 may be of a hierarchical structure (not shown) having a plurality of hierarchical levels according to the operating speeds, processing capacities, or the like of the circuit modules connected thereto.

The system controller 3 is externally supplied with a plural-bit mode signal 17, a reset signal 16, etc. When the reset signal 16 is set to low level by power-on reset or hardware reset of the microcomputer 1, a reset operation is performed in the microcomputer 1 in the low level period. After reset cancellation by the reset signal 16, the operating mode of the microcomputer 1 is determined according to the status of the plural-bit mode signal 17. The CPU 2 reads the top vector of a program area according to the operating mode, fetches an instruction at the corresponding address, decodes the fetched instruction, and starts executing the instruction. The RAM 4 is used as a work area for the CPU 2 and also as an area for temporarily storing data or a program.

The flash memory 5 is used as an area for storing a program and data of the CPU 2 and is electrically erasable/writable. The flash memory controller 11 controls operating procedures for erase and write on the flash memory 5 according to an initial setting of the CPU 2. A high voltage Vpp for erase and write on the flash memory 5 is generated by the boosting circuit 6 which boosts a power supply voltage. Here, a high voltage Vpp means a positive high voltage and a negative high voltage. The voltage trimming circuit 7 finely adjusts the write voltage obtained by the boosting circuit 6. The frequency divider circuit 8 produces an erase/write control clock signal $\phi/n$ by dividing the frequency of an oscillation signal $\phi$ generated by the oscillation circuit 10, and supplies the erase/write control clock signal $\phi/n$ to the flash memory 5. The erase/write clock signal φ/n is made a basis of generating an erase pulse signal for defining an erase voltage applying time to the flash memory 5 and a write pulse signal for defining a write voltage applying time to the flash memory 5.

The input/output port 13 is used as means for connection to an external address bus and an external data bus and as an external interface for the peripheral circuits 14.

The CPU 2 has an arithmetic section and an instruction control section (not shown). The arithmetic section includes an arithmetic unit such as an arithmetic logic unit ALU, and registers including a general purpose register and a program counter or the like. The instruction control section controls an instruction execution procedure by decoding instructions at instruction addresses designated by the program counter.

Figure 2:
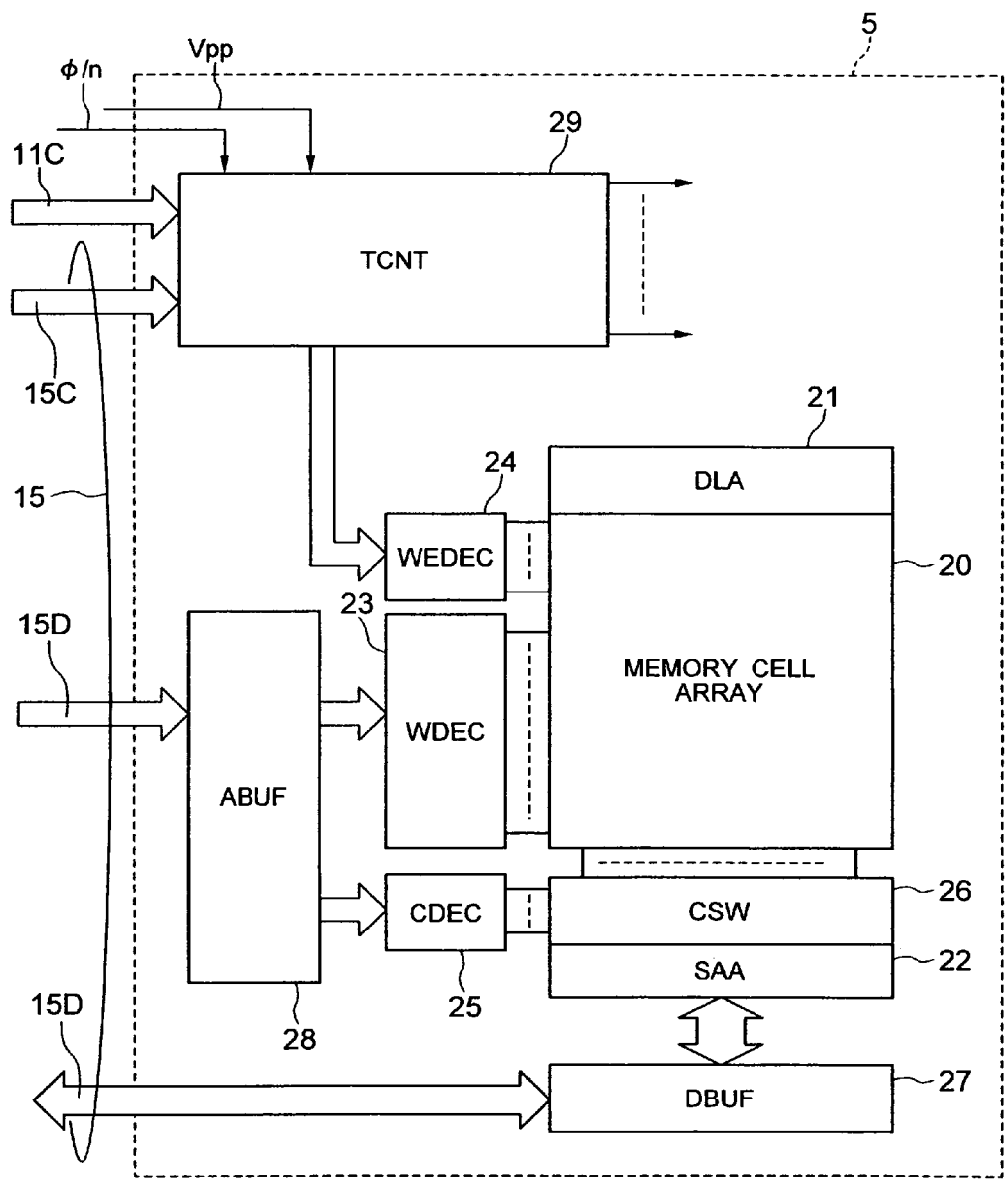
FIG. 2 is a block diagram of flash memory in the microcomputer shown in FIG. 1.

FIG. 2 shows in block diagram, the flash memory 5. The flash memory 5 has a memory cell array 20, a data latch array (DLA) 21, a sense amplifier array (SAA) 22, a word line decoder (WDEC) 23, a well decoder (WEDEC) 24, a bit line decoder (CDEC) 25, a column switch array (CSW) 26, a data buffer (DBUF) 27, an address buffer (ABUF) 28, and a timing controller (TCNT) 29. The memory cell array 20 has flash memory cells (not shown) which are nonvolatile storage elements arranged in matrix form. The flash memory cells, not limited to a particular type, have, for example, a stack structure in which a source and a drain are formed in a semiconductor substrate or a well region, and a floating gate and a control gate are respectively formed above the channel with an insulating film interposed therebetween. The source is connected to a source line, the drain to a bit line, and the control gate to a word line.

The threshold voltage of the flash memory cell can be set according programming. Information is held by means of the threshold voltage according programming. For example, if one flash memory cell holds one bit of information, a state of a relatively high threshold voltage is referred to as a written state, and a state of a relatively low threshold voltage is referred to as an erased state. A write operation for setting the cell in the written state, which is not specified particularly limitatively, may be such that a current is caused to flow through the path between the drain and source by applying 10 V to the control gate, applying, for example, 5 V to the drain, and applying, for example, 0 V to the source and to the substrate. Hot electron injection is thereby caused to accumulate electrons on the floating gate, thereby increasing the threshold voltage of the memory cell. An erase operation for setting the cell in the erased state, which is not specified particularly limitatively, may be such that electrons accumulated on the floating gate are released to the substrate by applying −10 V to the control gate, applying, for example, +10 V to the substrate, and setting the source and the drain, for example, in the open state (floating state). The threshold voltage of the memory cell is thereby reduced.

To the TCNT 29, bus commands relating to memory access, etc., are input from a control bus 15C included in the bus 15. The TCNT 29 is also supplied with write and erase operation control information 11C from the flash memory controller 11, and with the high voltage Vpp for erase and write and the control clock signal φ/n. The TCNT 29 generates necessary operating voltages and operating timing signals according to a readout, erase, or write operation and supplies the voltages and signals to the sections of the flash memory 5 when the flash memory 5 is instructed to perform the operation through control information 11C and a bus command.

To the address buffer 28, an address signal is input from an address bus 15A included in the bus 15. The address signal input to the address buffer 28 is input to the WDEC 23 and CDEC 25 and decoded by each decoder. The WDEC 23 selects some of word lines according to the result of decoding. The CDEC 25 selects some of bit lines according to the result of decoding through the CSW 26. A selection is made from the flash memory cells according to the word line selection and the bit line selection. In the case of a readout operation, data read out from each selected flash memory cell is sensed by the SAA 22 and is output to a data bus 15D included in the bus 15 through the data buffer 27. In the case of a write operation, data to be written is supplied to the data buffer 27 from the data bus 15D and is latched by the data latch array 21, and write and write blockage on the word-line-selected memory cells are controlled according to the latched data. Erasing is performed on a well basis. Erase block information contained in control information 11C is supplied to the WEDEC 24 via the TCNT 29, and data in the memory cell blocks in the wells selected in the WEDEC 24 is erased.

Figure 3:
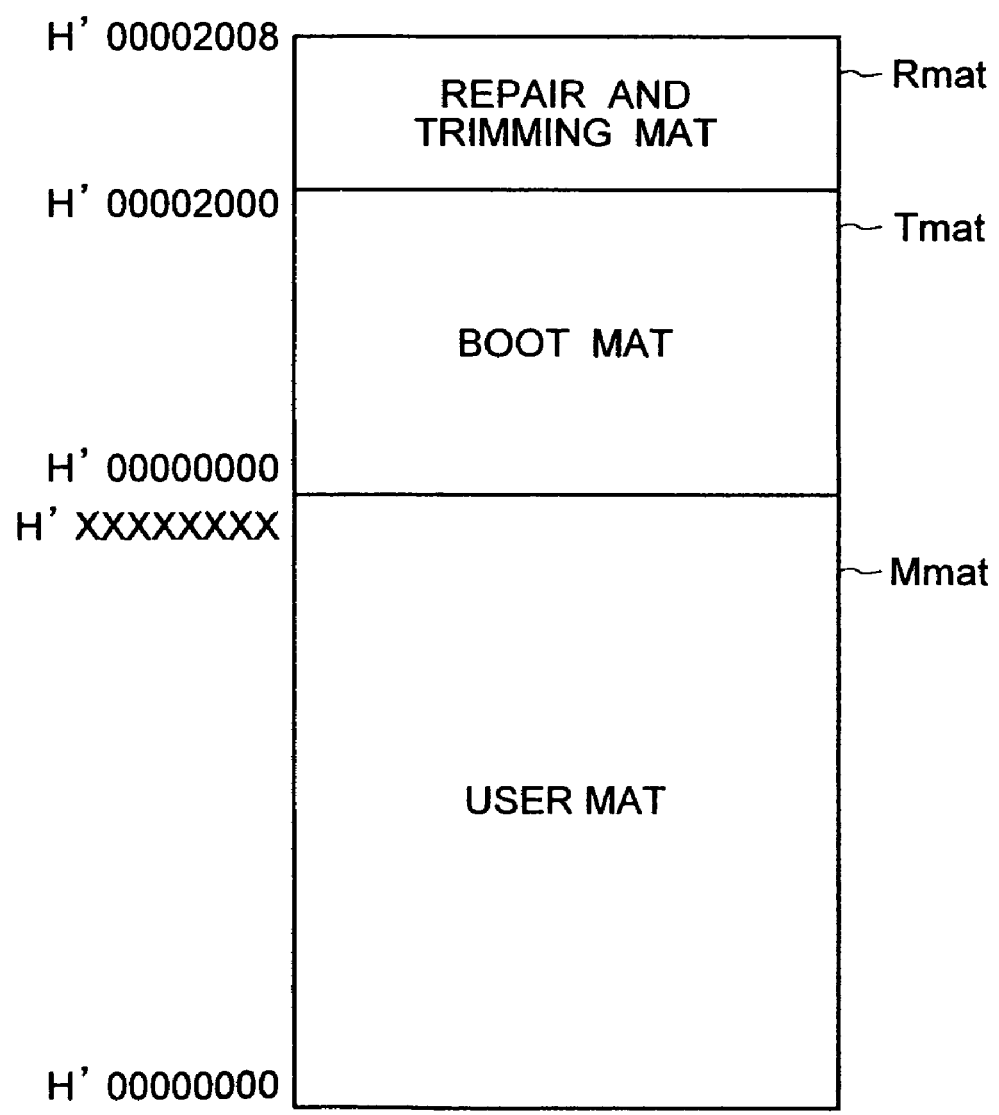
FIG. 3 is a diagram showing memory mats in the flash memory.

FIG. 3 illustrates memory mats in the flash memory. The memory cell array 20 of the flash memory 5 has a boot mat Tmat as a first storage area, a user mat Mmat as a second storage area, and a repair and trimming mat Rmat as a third storage area. To each of the boot mat Tmat and the user mat Mmat, memory space is assigned by setting, as a start address, 0 address (H'0000000) which is a top address in the address space of the CPU 2. That is, the boot mat Tmat and the user mat Mmat overlap each other in the address space, and an address decode logic is selected in response to an instruction which determines a selection among the mats to be used by the address decoders WDEC 23 and CDEC 25. A selection among the mats for use is determined, for example, according to the operating mode of the microcomputer designated by the mode signal 17. Programs for erase processing and write processing on the flash memory 15, a testing program, etc., are stored on the boot mat Tmat. On the repair and trimming mat Rmat is stored control data to be set in trimming circuits for adjustment according to defect relief addresses in the memory call array and circuit characteristics, e.g., the voltage trimming circuit 7 and the division ratio trimming circuit 9. Groups of control data respectively stored therein are read out in predetermined sequential form after reset cancellation to be respectively loaded initially into trimming registers in the voltage trimming circuit 7 and the division ratio trimming circuit 9. Thereafter, the voltage trimming circuit 7 and the division ratio trimming circuit 9 generate the high voltage Vpp and the control clock signal φ/n, which have already been adjusted to the circuit characteristics according to the initially loaded control data. This voltage and this signal are supplied to the flash memory 5.

<<Voltage Trimming>>

Formation of control data for the voltage trimming circuit which is to be stored on the repair and trimming mat Rmat will next be described.

Figure 4:
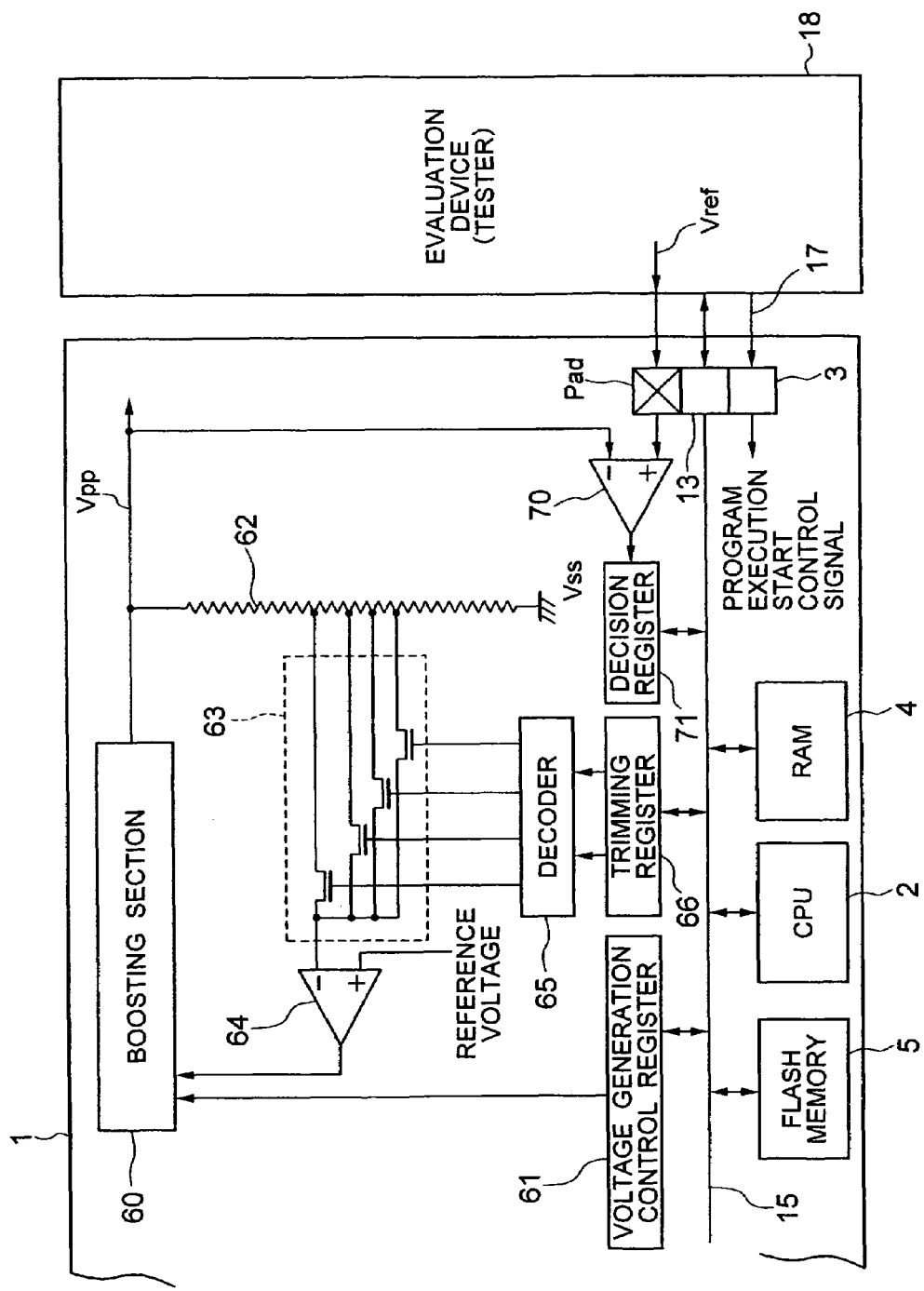
FIG. 4 is a block diagram showing an example of a circuit configuration for voltage trimming in the microcomputer shown in FIG. 1.

FIG. 4 shows an example of a circuit configuration for voltage trimming. The boosting circuit 6 is constituted by circuit components indicated by 60 to 66. That is, the boosting circuit 6 has a boosting section 60 formed by using a charge pump circuit or the like. The boosting section 60 becomes able to perform charge pumping when operation start instruction data is set in a voltage generation control register 61. A boosted voltage Vpp output from the boosting section 60 is divided by a voltage dividing circuit 62, and one of a plurality of voltages obtained by this dividing is selected by a selector 63. A voltage corresponding to the difference between the selected divided voltage and a reference voltage is generated by a differential amplifier 64 to be fed back to the boosting section 60. The level of boosted voltage Vpp is determined by this negative feedback control. The selection point in the selector 63 is selected according to an output from a decoder 65, and set values in a trimming register 66 are supplied to the decoder 65. The amount of feedback is changed according to the value of control data set in the trimming register 66. It is possible to perform fine adjustment (trimming adjustment) of the high voltage Vpp by selecting suitable control data.

To enable the high voltage Vpp to be obtained at a target value by the above-described fine adjustment, a comparison circuit 70, which operates as a decision circuit, and a decision register 71 are provided. The comparison circuit 70 compares an expected voltage Vref supplied as a comparative voltage from an external evaluation device 18 and the voltage Vpp generated by the boosting section 60. The result of comparison from the comparison circuit 70 is held in the decision register 71. The decision register 71 is connected to the bus 15 along with the trimming register 66 and the voltage generation control register 61 to be accessible from the CPU 2. In trimming processing, the CPU 2 functions as a control circuit to determine control data on the trimming register 66 with reference to the value in the decision register 71, and to store the determined control data from the trimming register 66 on the repair and trimming mat Rmat in the flash memory 5.

The CPU 2 is enabled to operate for trimming processing when the system controller 3 is provided with an instruction in the mode signal 17 to start the operation in a test mode, although it is not always necessary to start testing in this manner.

Figure 5:
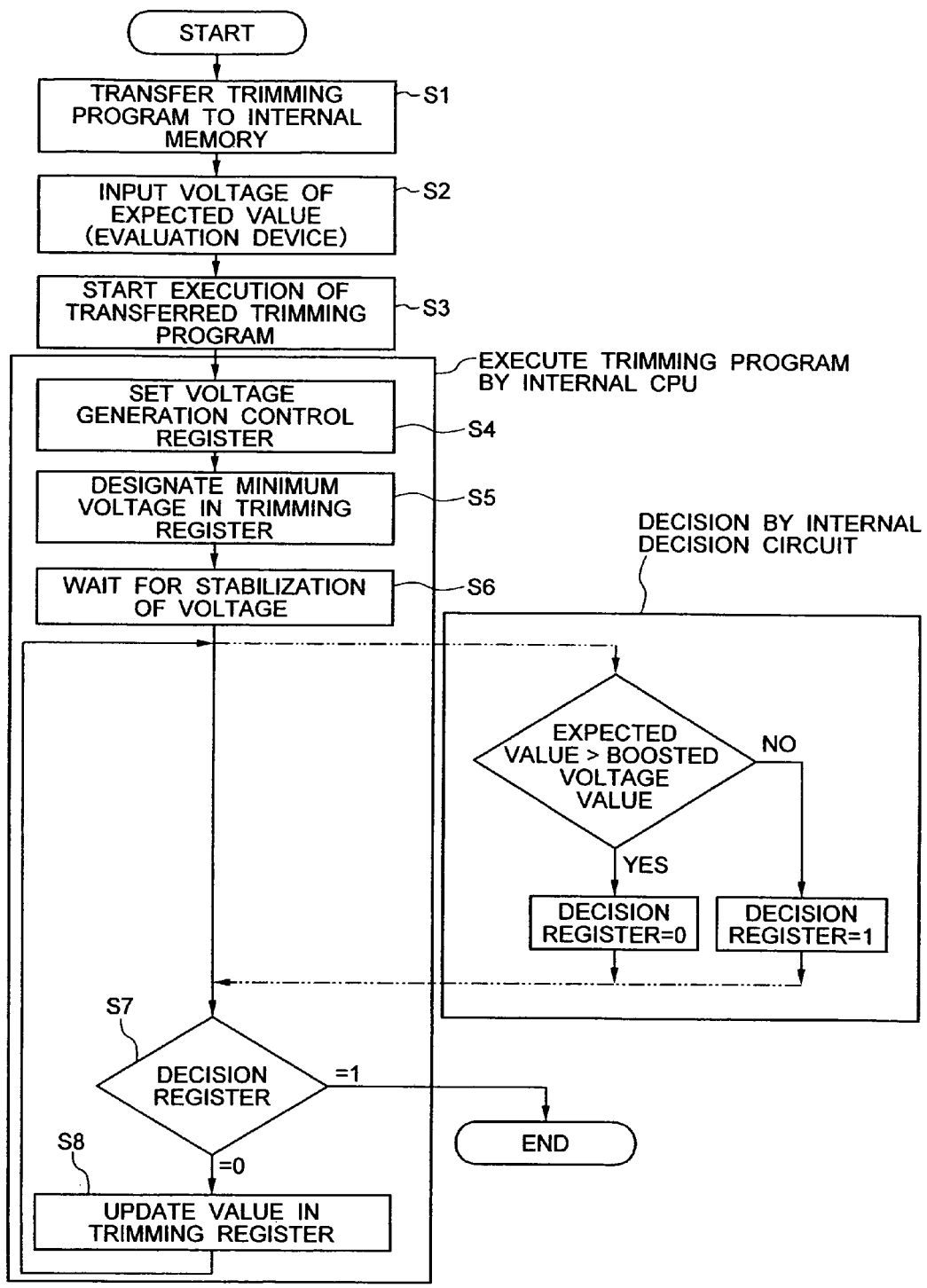
FIG. 5 is an overall flowchart of processing for obtaining trimming control data.

FIG. 5 shows an overall flowchart of an example of processing for obtaining trimming control data. The evaluation device 18 sets the test mode in the microcomputer 1 and downloads a program for trimming processing (trimming program) to a predetermined area in the RAM 4 (S1). Next, the evaluation device 18 supplies the expected voltage Vref to the comparison circuit 70 via an electrode pad "Pad" such as a bonding pad (S2) to instruct the CPU 2 to execute the trimming program (S3).

In executing the trimming program, the CPU 2 first sets operation start data in the voltage generation control register 61 (S4), and sets in the trimming register 66 control data designating a minimum voltage (S5). The CPU 2 executes a non-operation (NOP) instruction for a predetermined time period and waits for stabilization of the boosting operation of the boosting section 60 (S6). In this time period, the comparison circuit 70 compares the generated boosted voltage Vpp and the expected voltage Vref, sets "0" in the decision register 71 if Vref>Vpp, and sets "1" in the decision register 71 if Vref≦Vpp. After execution of the NOP instruction for the predetermined time period, the CPU 2 checks the value in the decision register 71 (S7) and, if the result is "0", designates the second highest voltage as boosted voltage Vpp by updating the control data in the trimming register 66, executes a non-operation (NOP) instruction for a predetermined time period to wait for stabilization of the boosting operation of the boosting section 60 (S8), and again performs the above-described decision step (S7). When "1" is determined in the decision step (S7), the process moves out of the decision processing loop to terminate processing for obtaining trimming control data.

Figure 6:
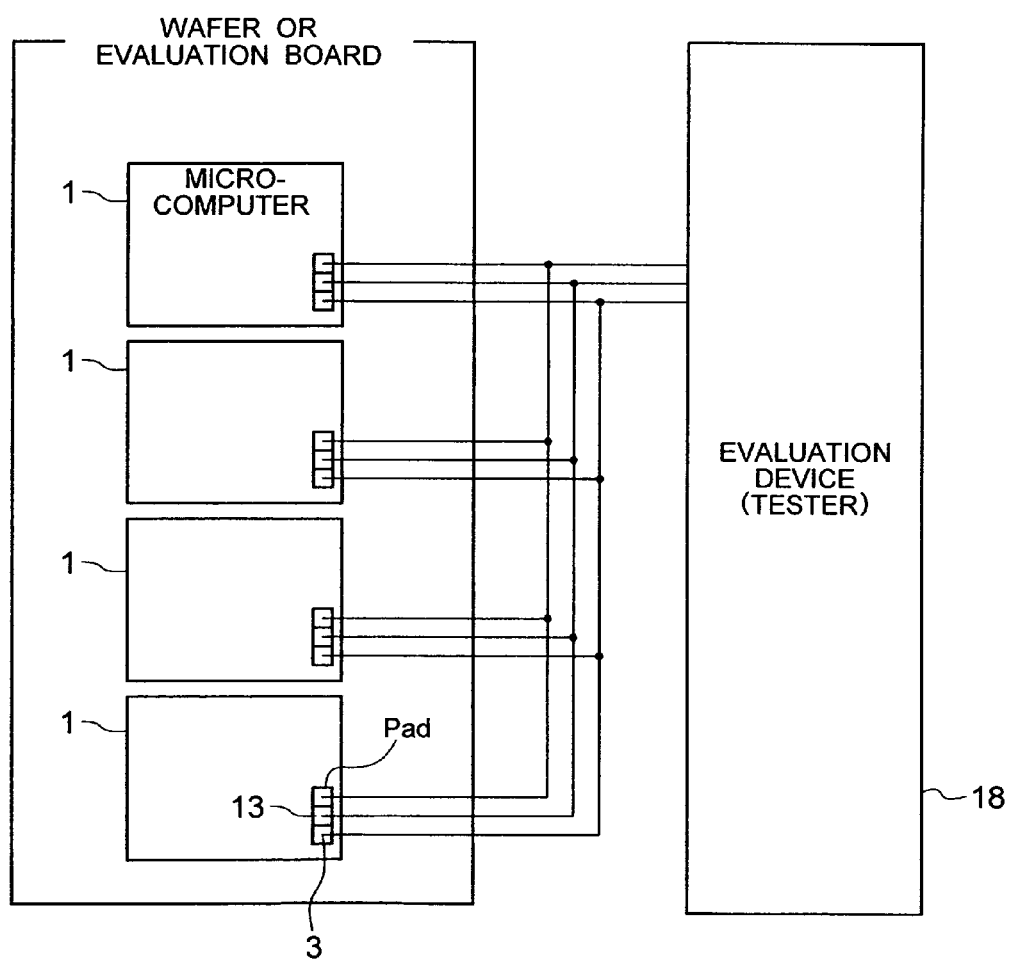
FIG. 6 is a diagram showing the connecting state at the time of connecting a plurality of microcomputers to an evaluation device and operating the microcomputers in parallel with each other.

Since the microcomputer 1 has the trimming register 66, the comparison circuit 70, and the CPU 2 as described above, it can perform processing for obtaining trimming control data in a self-completion manner. Therefore, trimming processing in a plurality of microcomputers 1 connected to the evaluation device 18 as shown in FIG. 6 can be performed with efficiency by making the microcomputers operate in parallel with each other.

After each microcomputer 1 has obtained trimming control data, it is instructed to write the control data in the trimming register 66 to a predetermined area of the repair and trimming mat Rmat in the flash memory. Receiving this instruction, the CPU 2 executes the corresponding processing routine in the above-described trimming processing program to make the data latch circuit 21 of the flash memory 5 latch the control data supplied from the trimming register 66, and to write the data in the data latch circuit 21 to the predetermined area of the repair and trimming mat Rmat.

Even after the control data has been written to the repair and trimming mat Rmat, it can be rewritten as long as the electrode pad "Pad" is exposed before the microcomputer 1 is packaged. This is because processing for obtaining and writing control data can be performed as desired through the program downloaded from the evaluation device 18.

Figure 7:
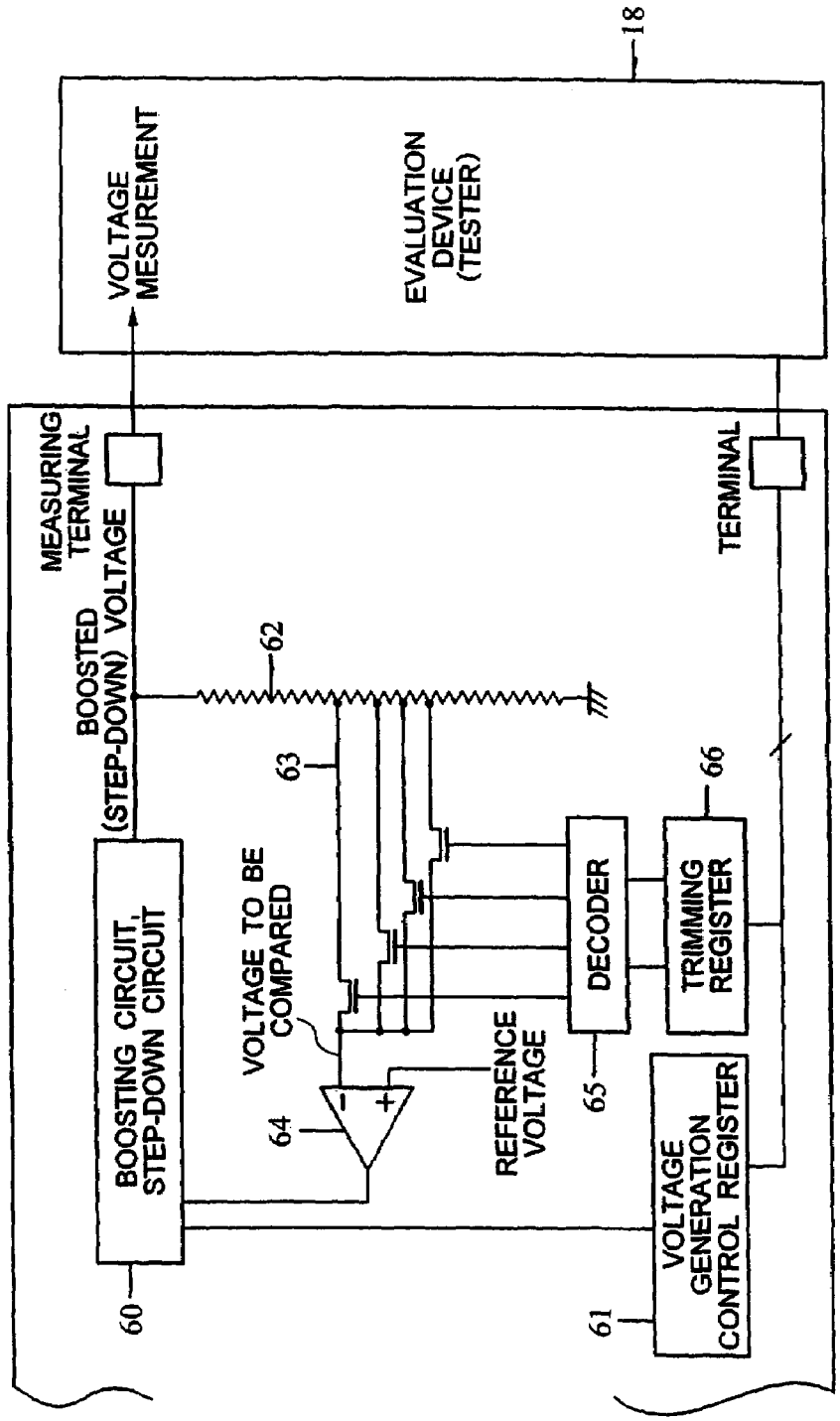
FIG. 7 is a diagram of a conventional arrangement in which a boosted voltage is supplied to an evaluation device through a measuring terminal.
Figure 8:
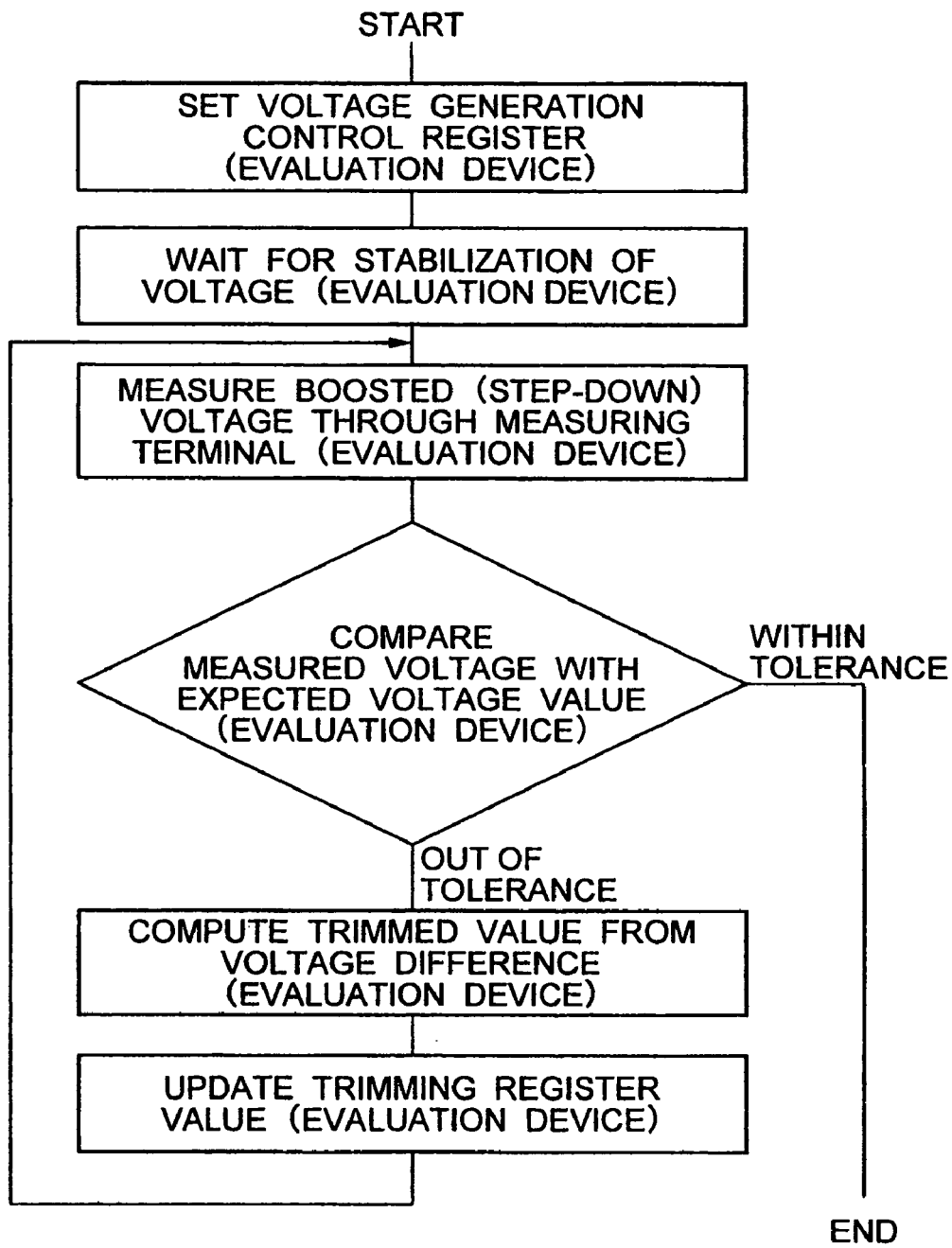
FIG. 8 is a flowchart of a conventional trimming method in which a decision is made by an evaluation device and a value in a trimming register is changed according to the decision result.
Figure 9:
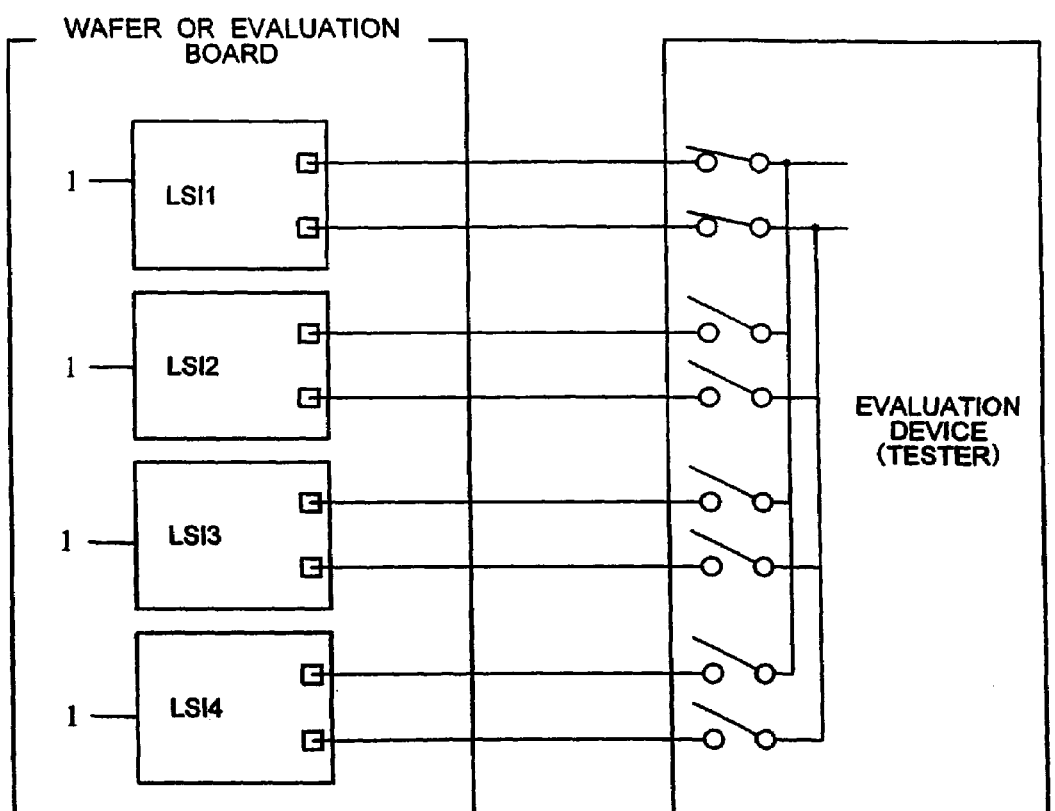
FIG. 9 is a diagram showing the connection between an evaluation device and microcomputers in the conventional art when the microcomputer computers undergo trimming one after another.

FIG. 7 shows for comparison with the present invention an arrangement which requires a process in which a boosted voltage is supplied to an evaluation device through a measuring terminal, decision is made by the evaluation device as shown in FIG. 8, and a value in a trimming register is updated according to the decision result from the evaluation device. In this case, therefore, it is necessary for the evaluation device to change a plurality of microcomputers one after another as the object to be adjusted by trimming, as shown in FIG. 9.

Figure 10:
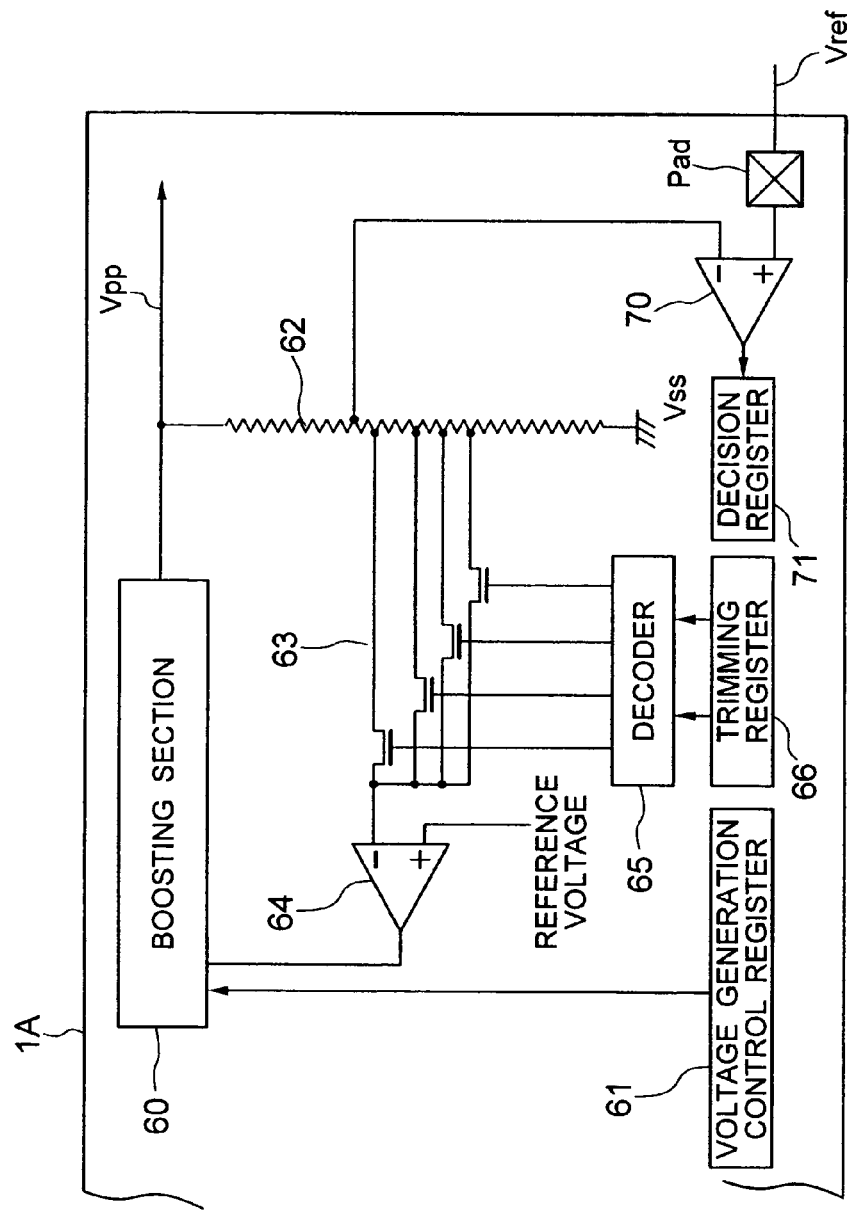
FIG. 10 is a block diagram showing a portion of a microcomputer as a modification of the arrangement shown in FIG. 4.

FIG. 10 shows a microcomputer 1A as a modification of the arrangement shown in FIG. 4. The difference of the arrangement shown in FIG. 10 from that shown in FIG. 4 resides in that one of voltages divided by the voltage dividing circuit 62 is used as the voltage input to the comparison circuit 70. For example, even if the boosted voltage Vpp is a high voltage of 10 V, the withstand voltage of the comparison circuit 70 can be reduced and a lower voltage level may suffice as the expected voltage Vref from the evaluation device 18.

Figure 11:
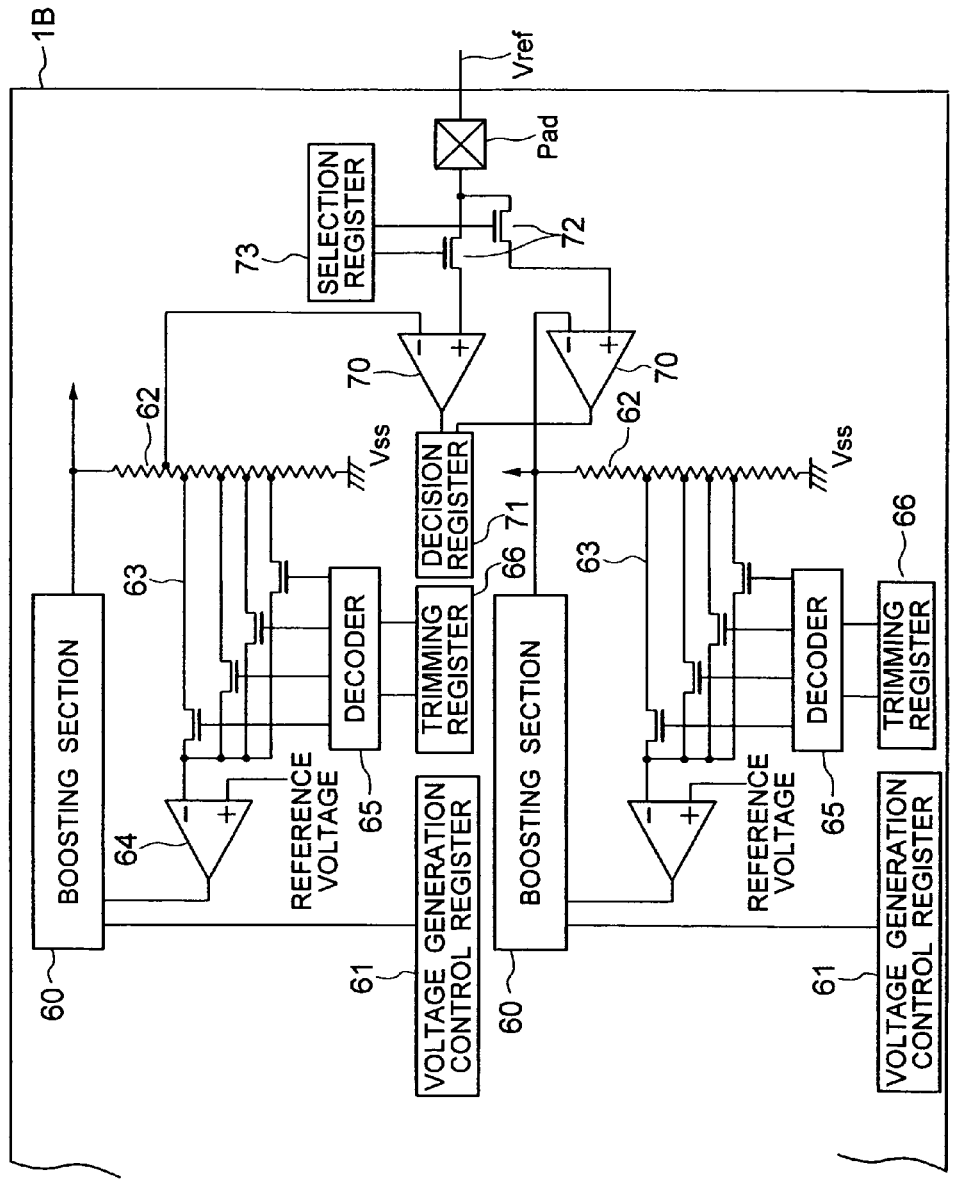
FIG. 11 is a block diagram showing a portion of a microcomputer as another modification of the arrangement shown in FIG. 4.

FIG. 11 shows a microcomputer 1B as another modification of the arrangement shown in FIG. 4. The difference of the arrangement shown in FIG. 11 from that shown in FIG. 4 resides in an arrangement for a plurality of boosting sections 60. That is, the electrode pad "Pad" through which expected voltage Vref is input is used as a common point for supply of the voltage to a plurality of comparison circuits 70, and one of the comparison circuits 70 selected by selecting switches 72 can be supplied with the expected voltage Vref. The selecting switches 72 perform the selecting operation according to a set value in a selection register 73 provided in the address space of the CPU 2. In the microcomputer shown in FIG. 11, use of the decision register 71 is shared among the plurality of comparison circuits 70. While in the microcomputer shown in FIG. 11 the selecting switches 72 switch the paths for the input Vref, the arrangement may alternatively be such that the outputs from the voltage dividing circuits 62 are switched and only one comparison circuit 70 is used. The arrangement shown in FIG. 11 has the effect of reducing the number of electrode pads "Pad" used for trimming processing only.

Figure 12:
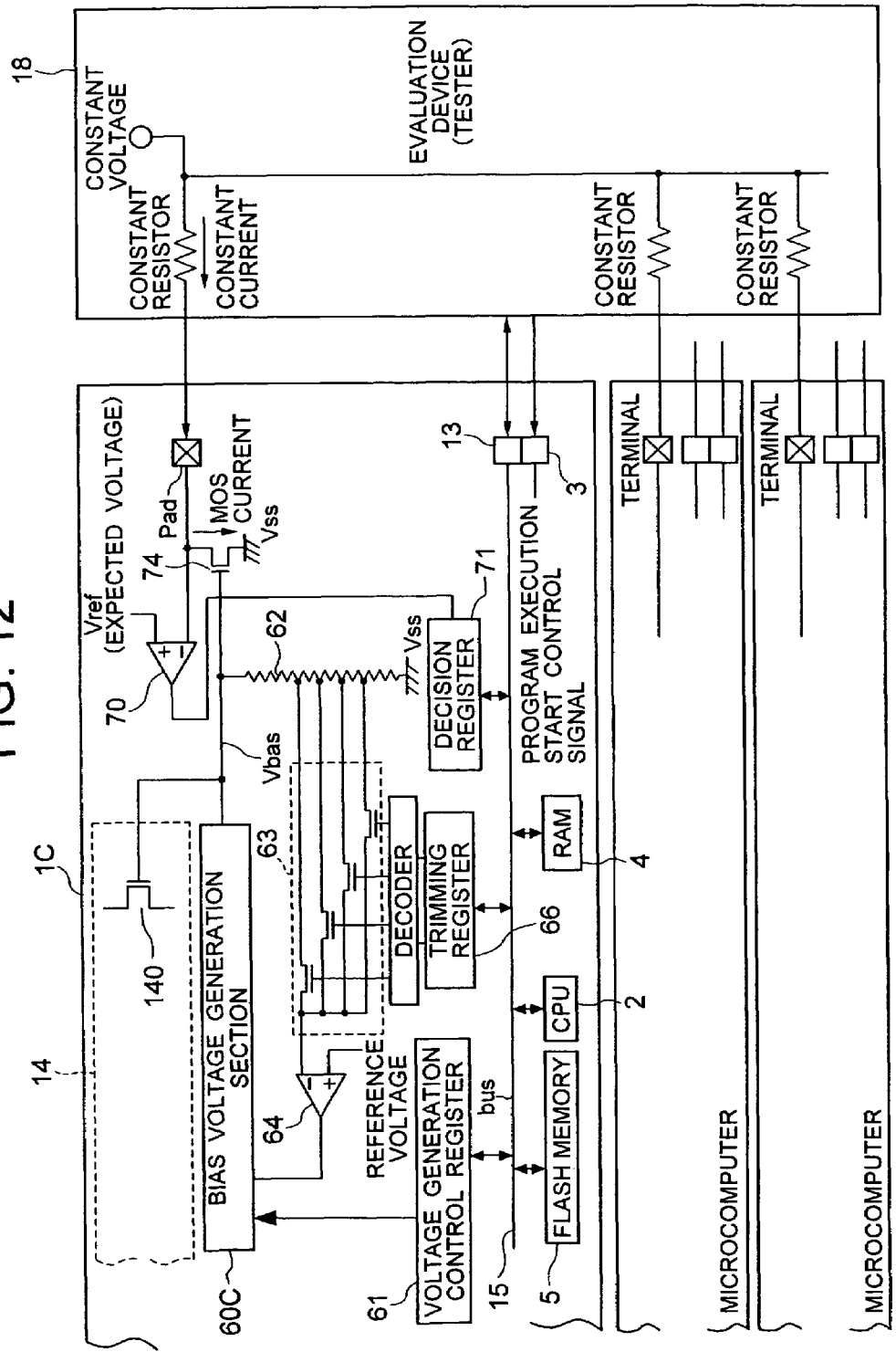
FIG. 12 is a block diagram showing a portion of a microcomputer as still another modification of the arrangement shown in FIG. 4.

FIG. 12 shows a microcomputer 1C as still another modification of the arrangement shown in FIG. 4. The arrangement shown in FIG. 12 is applied to current trimming. For example, in a case where the current through a power supply MOS transistor 140 in a circuit included in the peripheral circuit 14 greatly influences the circuit characteristics, a bias voltage generation section 60C applies a finely adjustable bias voltage Vbas to the MOS transistor 140. To enable this biasing, a dummy MOS transistor 74 formed by the same process as the power supply MOS transistor 140 is prepared and the bias voltage Vbas of the bias voltage generation section 60C is applied to the gate electrode of the dummy MOS transistor 74. The drain electrode of the dummy MOS transistor 74 is connected to the electrode pad "Pad", to which a constant current is supplied from the evaluation device 18 through a resistor. The comparison circuit 70 compares the voltage produced according to the current through the dummy MOS transistor 74 with the expected voltage Vref. In this arrangement, the expected voltage Vref is provided to set the current through the MOS transistor 140 using Vbas in common with the dummy MOS transistor 74 to a specified value.

In this arrangement, control data for generating the bias voltage Vbas for setting the current through the MOS transistor 140 to a specified value by updating the bias voltage Vbas according to the result of comparison made by the comparison circuit 70 can be obtained in the trimming register 66. The same trimming procedure as that in the case of the arrangement shown in FIG. 4 is used to obtain the same effect.

Figure 13:
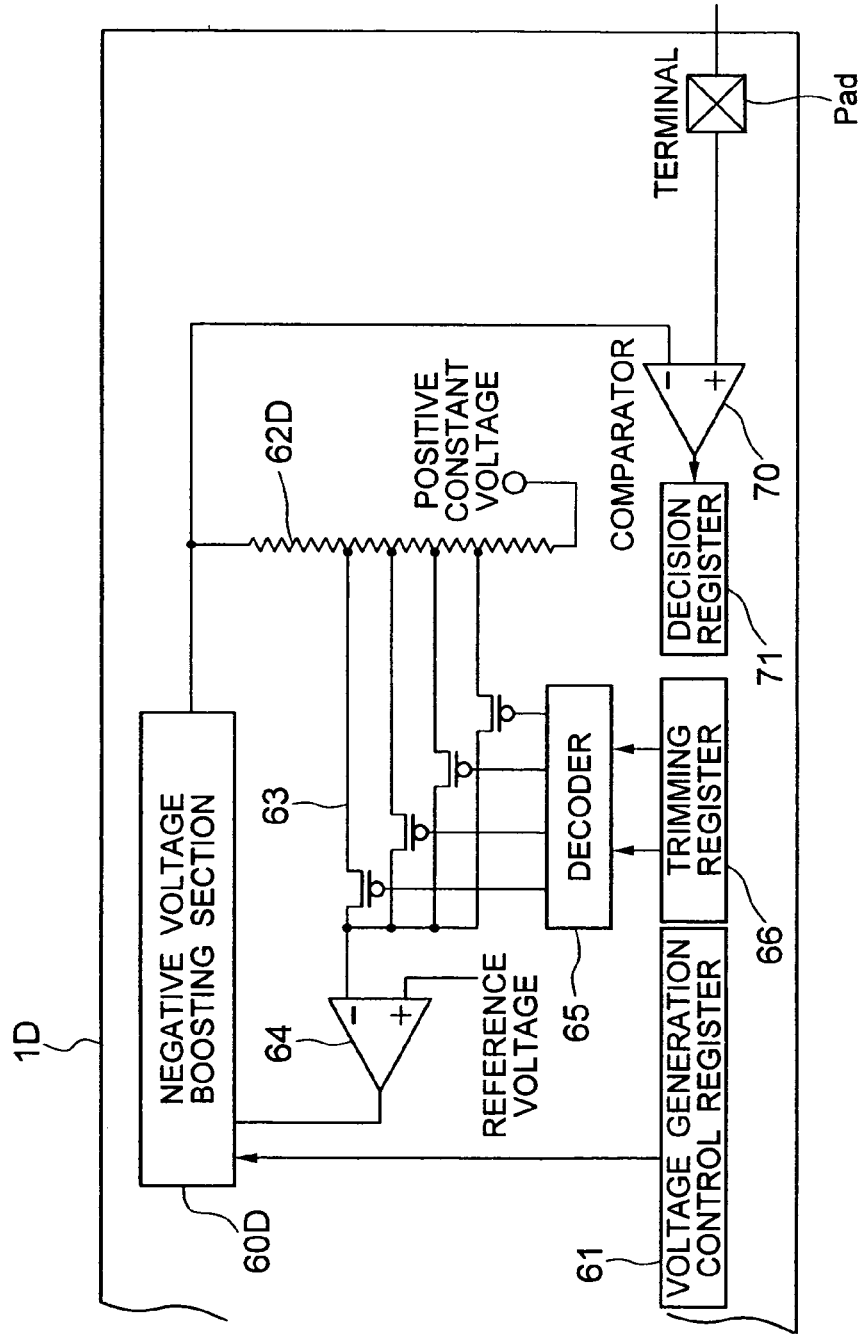
FIG. 13 is a block diagram showing a portion of a microcomputer as a further modification of the arrangement shown in FIG. 4.

FIG. 13 shows a microcomputer 1D as a further modification of the arrangement shown in FIG. 4. The difference of the arrangement shown in FIG. 13 from that shown in FIG. 4 resides in that the voltage trimming arrangement is applied to boosting of a negative voltage. A negative voltage boosting section 60D and a voltage dividing circuit 62D arranged to generate a negative voltage are prepared for negative voltage boosting. Also for negative voltage boosting, the same trimming procedure as that in the case of the arrangement shown in FIG. 4 is used to obtain the same effect.

Figure 14:
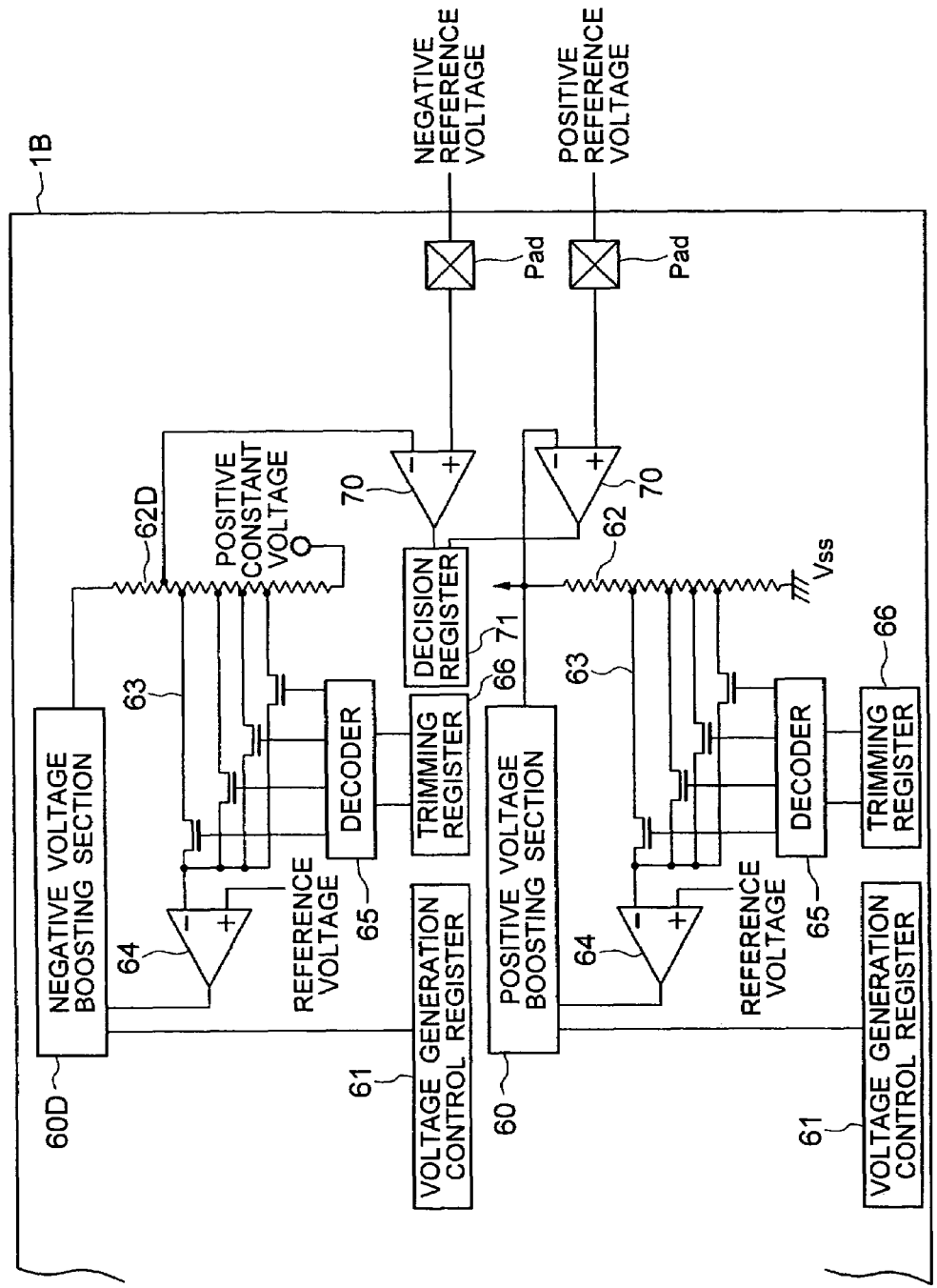
FIG. 14 is a block diagram showing a portion of a microcomputer as still a further modification of the arrangement shown in FIG. 4.

FIG. 14 shows a microcomputer 1E as still a further modification of the arrangement shown in FIG. 4. The microcomputer 1E has a configuration which is a combination of those respectively shown in FIGS. 4 and 13. Use of the decision register 71 is shared between the circuit for trimming for adjustment of a positive boosted voltage and the circuit for trimming for adjustment of a negative boosted voltage.

<<Division Ratio Trimming>>

Figure 15:
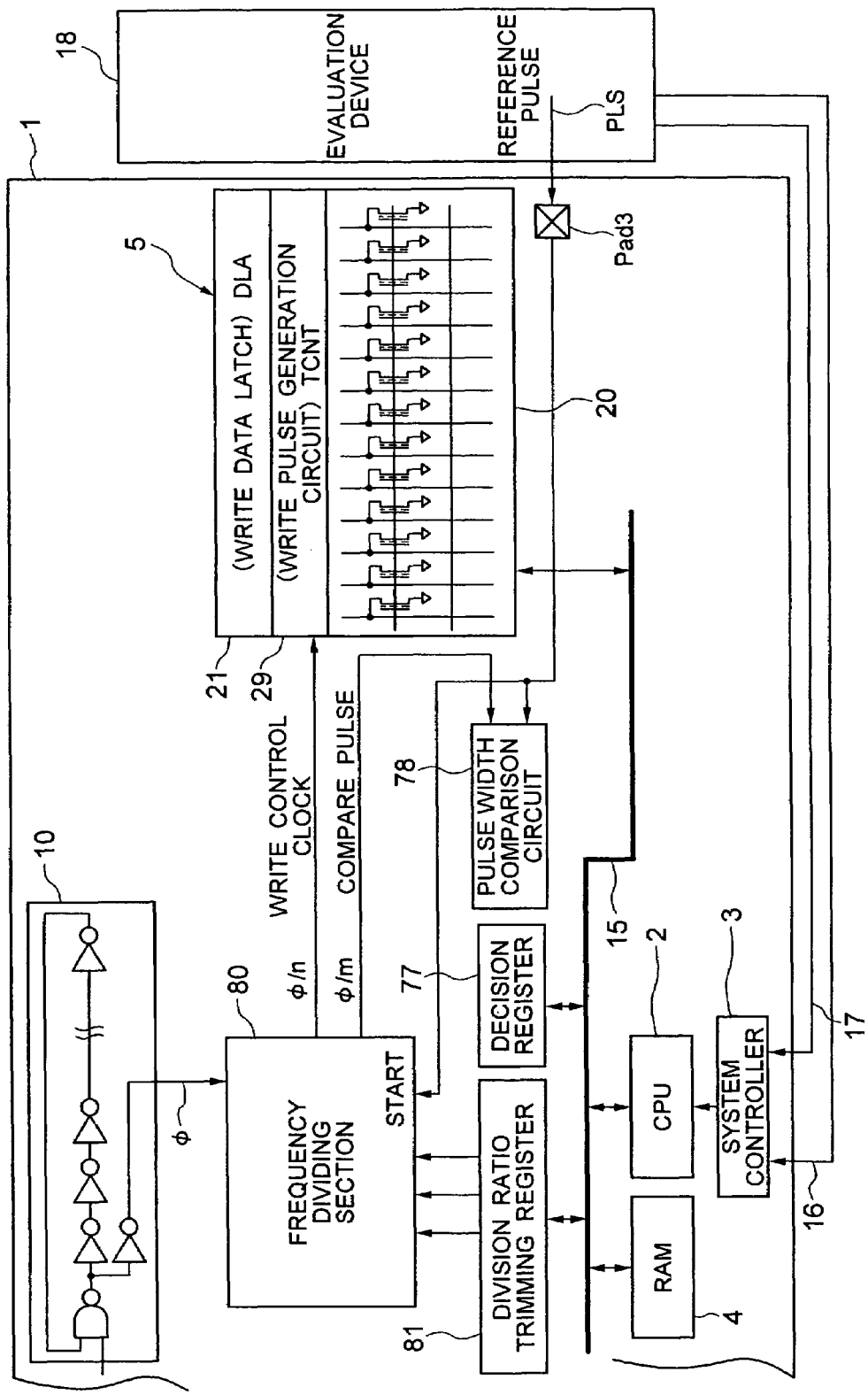
FIG. 15 is a block diagram showing a circuit configuration for division ratio trimming in a microcomputer.
Figure 16:
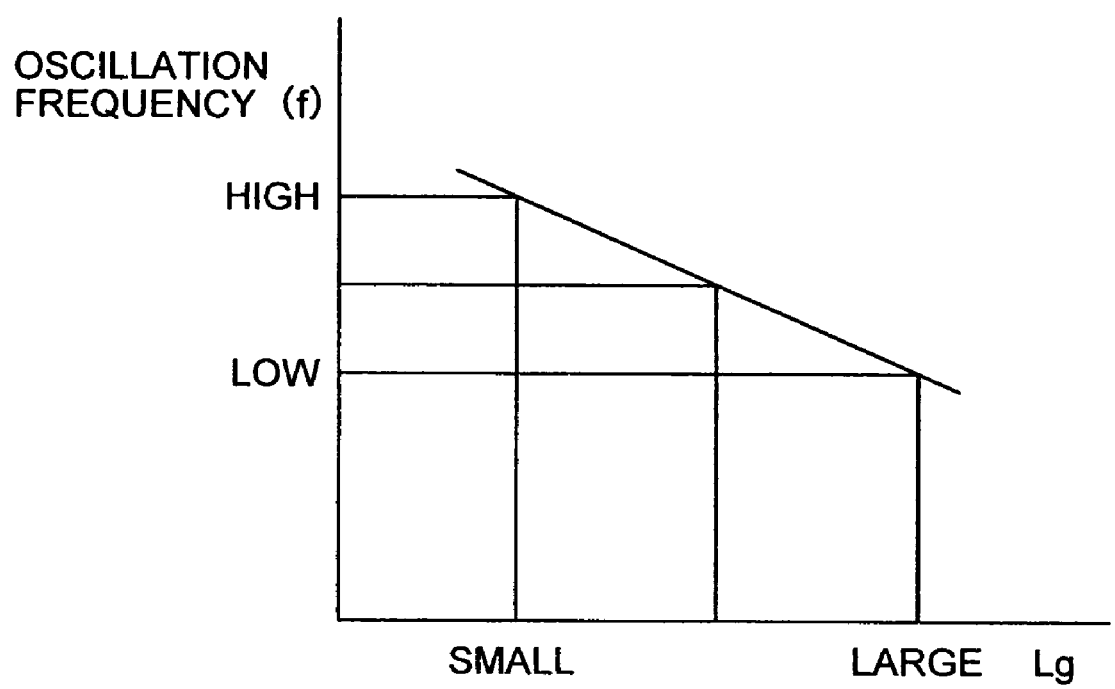
FIG. 16 is a diagram for explaining variation in oscillation frequency of an oscillation circuit.
Figure 17:
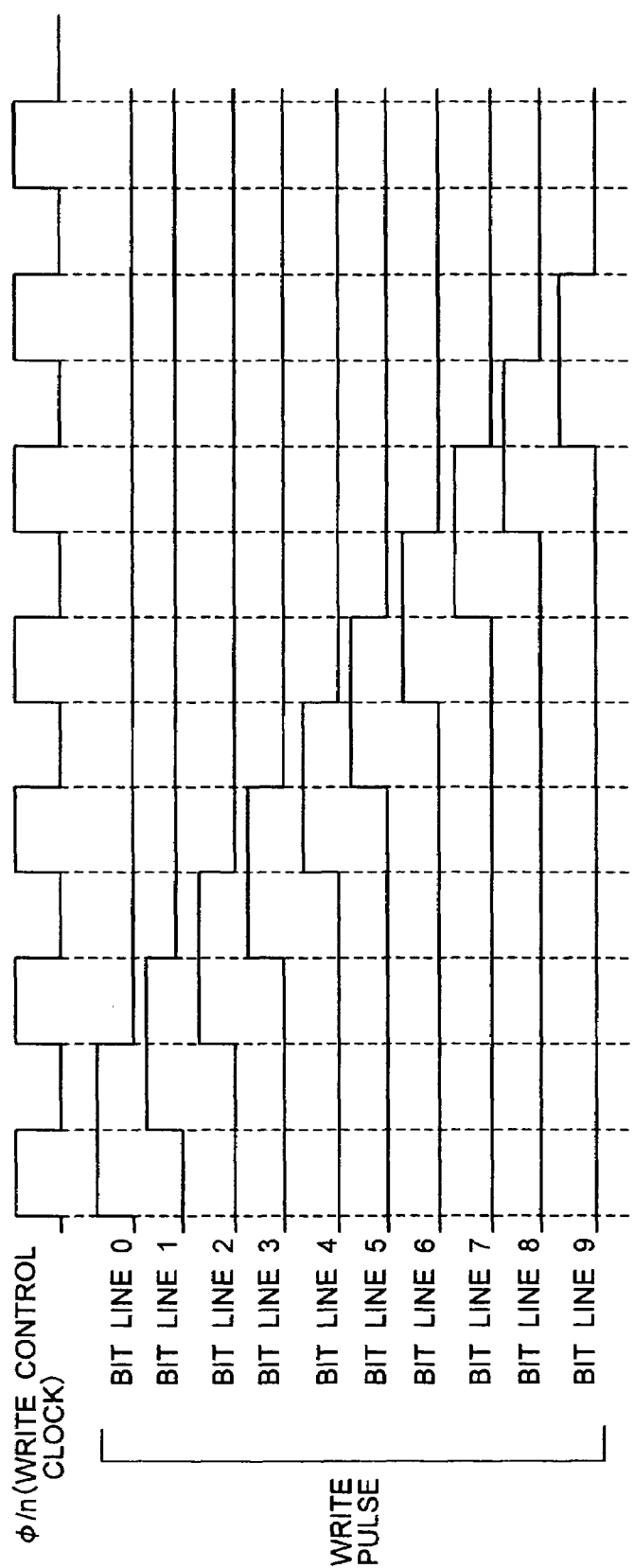
FIG. 17 is a diagram in which a write control clock signal is shown as a clock signal with which the pulse width of a write pulse signal in a flash memory is set to a specified value.

FIG. 15 illustrates a circuit configuration for division ratio trimming. The oscillation circuit 10 is formed of, for example, a ring oscillator and outputs clock signal $\phi$. The frequency divider circuit 8 is constituted by a frequency dividing section 80 and a division ratio trimming register 81. The oscillation frequency of the oscillation circuit 10 varies if the length (Lg) of the gate of a MOS transistor constituting the oscillation circuit 10 varies, as in an example of the relationship between the oscillation frequency and the gate length shown in FIG. 16. The frequency dividing section 80 divides the clock signal $\phi$ to generate a write control clock signal $\phi/n$ and a comparative pulse $\phi/m$. Numbers n and m are in a relationship of n≦m. The comparative pulse $\phi/m$ is obtained by further n/m dividing the control clock signal $\phi/n$. The write control clock signal $\phi/n$ is used in the flash memory 5 as a clock signal for setting the pulse with of the write control pulse signal to a specified value, as shown in FIG. 17. If the control clock signal $\phi/n$ has a comparatively low rate, a sufficiently large number of occurrences of the pulse width cannot be obtained. For this reason, a pulse $\phi/m$ obtained by dividing at a further increased division ratio is used as a comparative pulse.

A pulse width comparison circuit 78 and a decision register 77 are provided to enable fine adjustment of the pulse width. The pulse width comparison circuit 78 compares the pulse width of a reference pulse PLS supplied from the evaluation device 18 through an electrode pad "Pad 3" and the pulse width of the above-mentioned comparative pulse $\phi/m$ (e.g., positive pulse width), and returns the comparison result to the decision register 77. For example, in a case where control data is set in the order from the maximum pulse width in the division ratio trimming register 81, a determination is made as to whether the positive pulse width of the comparative pulse $\phi/m$ has become equal to or smaller than the positive pulse width of the reference pulse PLS, "0" is set when the pulse width of the comparative pulse is larger, and "1" is set when the pulse width of the comparative pulse is equal to or smaller than that of the reference pulse. The CPU 2 performs computation for determining control data on the division ratio trimming register 81 with reference to the decision result in the decision register 77. For example, the CPU 2 performs a control process in which when the decision result is "0", the control data is updated so that the comparative pulse width is reduced and, when the comparison result changes from "0" to "1", the control data is stored on the repair and trimming mat Rmat of the flash memory 5.

When the microcomputer obtains division ratio trimming control data, the evaluation device 18 downloads a program for division ratio trimming processing to a predetermined area in the RAM 4, and instructs the CPU 2 to execute the division ratio trimming program. In execution of the trimming program, the CPU 2 first sets, for example, control data designating the maximum pulse width in the division ratio trimming register 81. Then the evaluation device 18 supplies the reference pulse PLS to the pulse width comparison circuit 78 through the electrode pad "Pad 3", which is a bonding pad or the like. Simultaneously, the pulse width comparison circuit 78 determines whether the positive pulse width of the comparative pulse $\phi/m$ produced has become equal to or smaller than the positive pulse width of the reference pulse PLS. If the width of the comparative pulse is larger, the comparison circuit 78 sets "0" in the decision register 77. If the width of the comparative pulse is equal to or smaller than that of the reference pulse, the comparison circuit 78 sets "1" in the decision register 77. The CPU 2 checks the value in the decision register 77 and, if the value is "0", updates the control data in the division ratio trimming register 81 to reduce the pulse width of the comparative pulse $\phi/m$ one step and again performs the above-described decision operation. When "1" is determined by the decision operation, the control process moves out of the decision processing loop to terminate processing for obtaining division ratio trimming control data.

Since the microcomputer 1 has the division ratio trimming register 81, the pulse width comparison circuit 78, and the CPU 2 as described above, it can perform processing for obtaining division ratio trimming control data in a self-completion manner. Therefore, trimming processing in a plurality of microcomputers 1 connected to the evaluation device 18 can be performed with efficiency by making the microcomputers operate in parallel with each other.

After each microcomputer 1 has obtained division ratio trimming control data, it is instructed to write the control data in the division ratio trimming register 81 to a predetermined area of the repair and trimming mat Rmat in the flash memory 5. Receiving this instruction, the CPU 2 executes the corresponding processing routine in the above-described trimming processing program to make the data latch circuit 21 of the flash memory 5 latch the control data supplied from the division ratio trimming register 81, and to write the data in the data latch circuit 21 to the predetermined area of the repair and trimming mat Rmat.

Even after the control data has been written to the repair and trimming mat Rmat, it can be rewritten as long as the electrode pad "Pad 3", is exposed before the microcomputer 1 is packaged. This is because processing for obtaining and writing control data can be performed as desired according to the contents of a program downloaded from the evaluation device 18.

Figure 18:
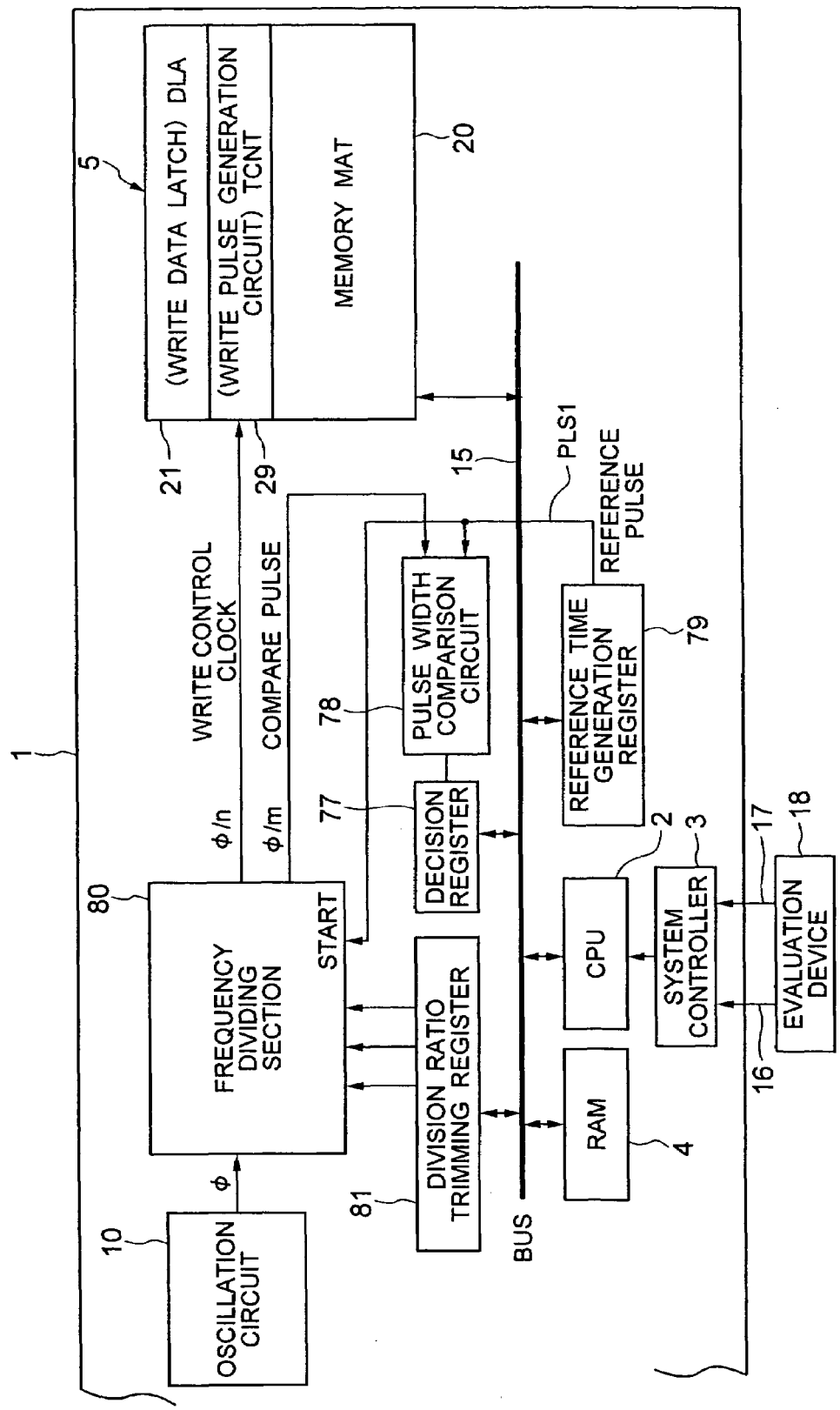
FIG. 18 is a block diagram showing another circuit configuration for division ratio trimming.

FIG. 18 illustrates another circuit configuration for division ratio trimming. The difference of the arrangement shown in FIG. 18 from that shown in FIG. 15 resides in that a reference time generation register 79 for generating a reference pulse is incorporated in the microcomputer 1. One bit in the reference time generation register 79 is defined as a reference time generation bit. This bit is supplied as reference pulse PLS1 to the pulse width comparison circuit 78. The reference time generation bit is set by the CPU 2 through the bus 15. Processing for generating the reference pulse PLS1 may be such that after the CPU 2 has set the reference time generation bit to "1", it is instructed to execute a NOP instruction through the time period corresponding to a predetermined number of cycles and to thereafter clear the reference time generation bit to "0". The reference pulse PLS1 is thereby formed as a positive pulse corresponding to the NOP instruction continuous execution time. This pulse is used in place of the reference pulse PLS externally supplied. In other respects the arrangement shown in FIG. 18 is the same as that shown in FIG. 15. The circuit components having the same functions as those shown in FIG. 15 are indicated by the same reference characters and the detailed description for them will not be repeated.

Figure 19:
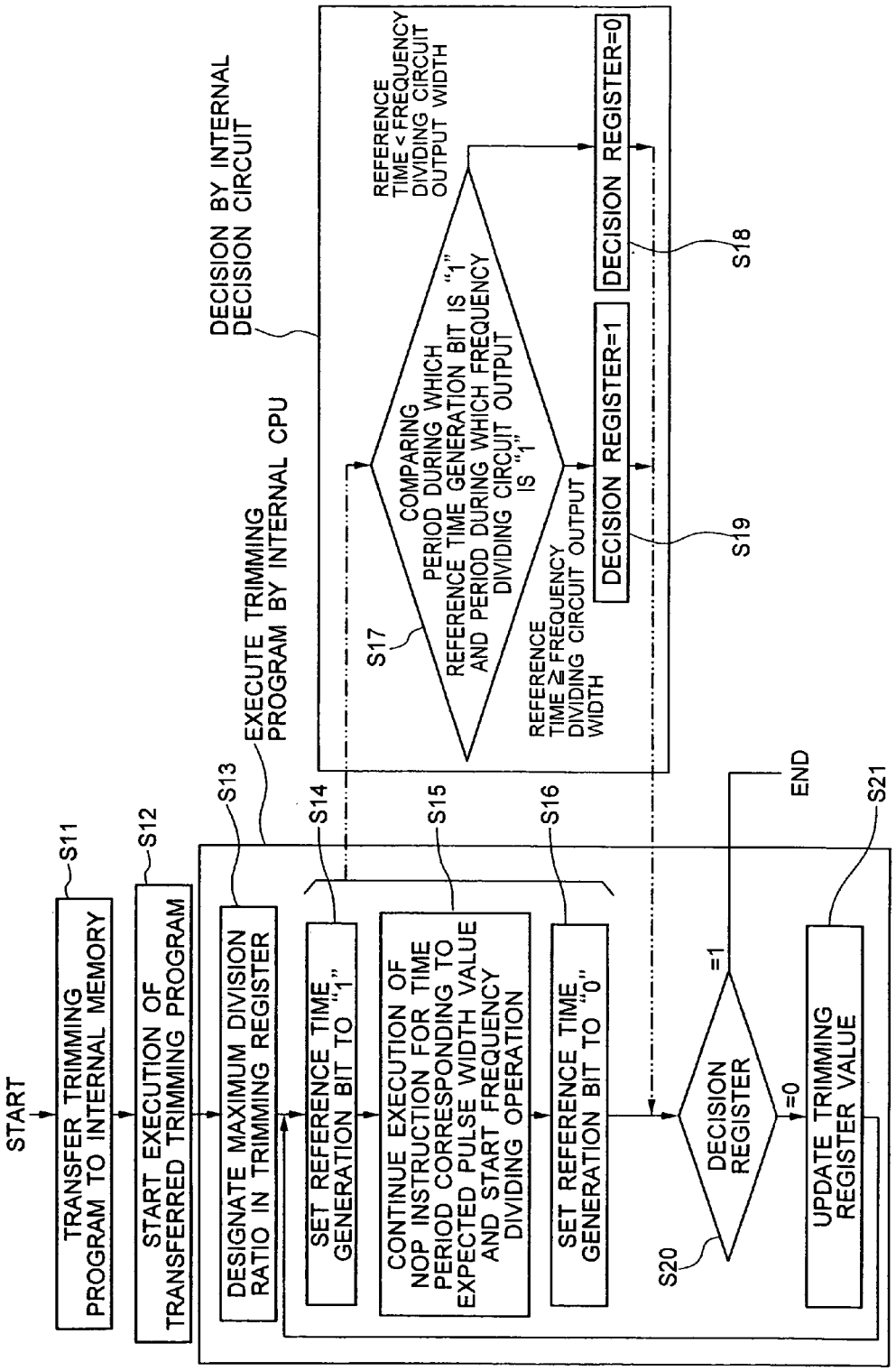
FIG. 19 is an overall flowchart of processing for obtaining division ratio trimming control data in the circuit shown in FIG. 18.

FIG. 19 is an overall flowchart of processing for obtaining division ratio trimming control data.

When the microcomputer obtains division ratio trimming control data, the evaluation device 18 downloads a program for division ratio trimming processing to a predetermined area in the RAM 4 (S11), and instructs the CPU 2 to execute the division ratio trimming program (S12). In execution of the trimming program, the CPU 2 first sets, for example, control data designating the maximum pulse width in the division ratio trimming register 81 (S13). Then the CPU 2 sets the reference time generation bit to "1" (S14), makes the frequency dividing section 80 start the frequency dividing operation, executes the NOP instruction through the time period corresponding to a predetermined number of cycles (S15), and thereafter clears the reference time generation bit to "0" (S16), thereby generating reference pulse PLS1 as a positive pulse corresponding to the NOP instruction continuous execution time. The pulse width comparison circuit 78 determines whether the positive pulse width of the comparative pulse φ/m produced by the frequency dividing section 80 (frequency dividing circuit output width) has become equal to or smaller than the positive pulse width of the reference pulse PLS 1 (reference time) (S17). If the width of the comparative pulse is larger, the comparison circuit 78 sets "0" in the decision register 77 (S18). If the width of the comparative pulse is equal to or smaller than that of the reference pulse, the comparison circuit 78 sets "1" in the decision register 77 (S19). The CPU 2 checks the value in the decision register 77 (S20) and, if the value is "0", updates the control data in the division ratio trimming register 81 to reduce the pulse width of the comparative pulse φ/m one step (S21) and again performs the above-described decision operation. When "1" is determined by the decision operation, the control process moves out of the decision processing loop to terminate processing for obtaining division ratio trimming control data.

After the microcomputer 1 has obtained the division ratio trimming control data, it is instructed to write the control data in the division ratio trimming register 81 to a predetermined area of the repair and trimming mat Rmat in the flash memory 5. Receiving this instruction, the CPU 2 executes the corresponding processing routine in the above-described trimming processing program to make the data latch circuit 21 of the flash memory 5 latch the control data supplied from the division ratio trimming register 81, and to write the data in the data latch circuit 21 to the predetermined area of the repair and trimming mat Rmat.

FIG. 20 shows an example of the relationship between the set value in the division ratio trimming register 81 and the division ratio determined by the set value. In the example shown in FIG. 20, the division ratio trimming register 81 stores three bits and the division ratio ranges from 1/64 to 1/36 according to the set three-bit value. Accordingly, if a frequency of 1.0 MHz is assumed as a target value with respect to the write control clock φ/n after trimming, the relationship between the oscillation frequency of the ring oscillator and the division ratio is as exemplified in FIG. 20.

FIGS. 21A and 21B illustrates the relationship between the reference pulse PSL1 set to a specified value by using the reference time generation bit and the pulse width of the reference pulse φ/m. At the beginning of trimming processing, the set value in the division ratio trimming register 81 is (0, 0, 0) and the pulse width of the reference pulse φ/m is maximized, as shown in FIG. 21A. In FIG. 21B is illustrated a state immediately after a time when the pulse width of the reference pulse φ/m becomes smaller than that of the reference pulse PLS1 in the process of changing the pulse width by updating the set value in the trimming register step by step.

Figure 22:
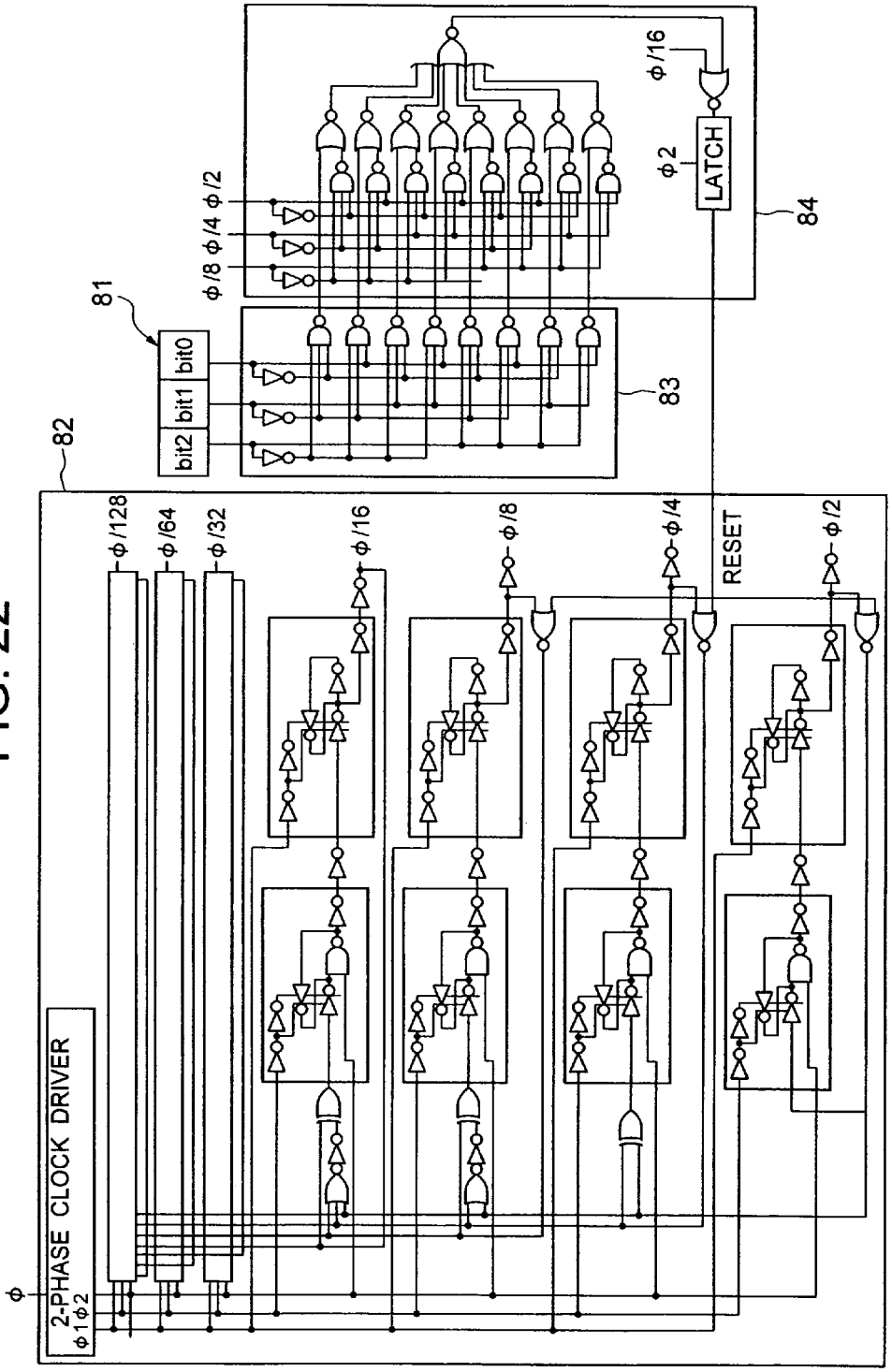
FIG. 22 is a logic circuit diagram showing details of the frequency dividing section.
Figure 23:
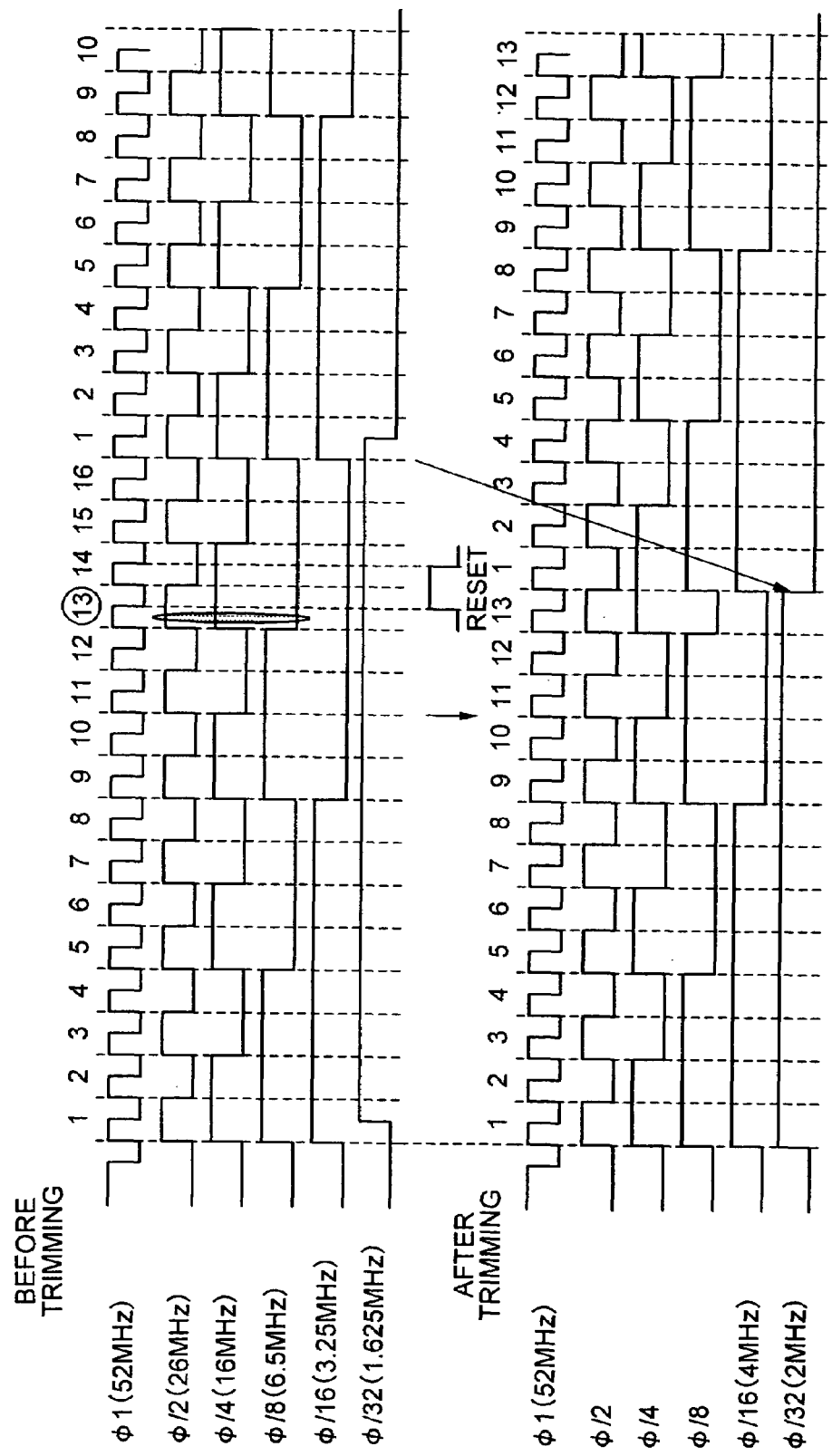
FIG. 23 is a timing chart of the operation of the circuit shown in FIG. 22.

FIG. 22 shows details of the frequency dividing section 80. FIG. 23 is a timing chart of an example of the operation of the circuit shown in FIG. 22. The frequency dividing section 80 has a counter 82 as its major component and has a decoder 83 and a coincidence determination circuit 84 for adjusting the division ratio (pulse width). The counter 82 has seven counter stages from φ/2 to φ/128 for counting two-phase clock components φ1 and φ2 of clock signal φ. It is assumed here that, for example, φ/64 is φ/n=φ/m. The decoder 83 decodes control data in the division ratio trimming register 81, activates one signal corresponding to the control data, and outputs the activated signal. The coincidence determination circuit 84 determines one of cycle positions in the first to sixteen cycles of the clock signal φ to which the position of the activated signal output from the decoder 83 coincides. The determination result is latched in synchronization with φ2 and is supplied as a count value reset signal to the φ/2, φ/4, and φ/8 counter stages. In the example shown in FIG. 23, the thirteenth cycle of the clock signal φ is selected as a reset time. Then the count values at the φ/2, φ/4, and φ/8 counter stages are reset and the statuses thereof are transferred to the upper counters. Consequently, the φ/16 clock signal is updated one cycle, the φ/32 clock signal is updated half cycle, the φ/64 signal depends on the updated cycle of the φ/32 signal, and the φ/128 signal depends on the updated cycle of the φ/64 signal, thus finely adjusting the pulse widths of pulses φ/n and φ/m. In short, the division ratios of pulses φ/n and φ/m are finely adjusted.

Figure 24:
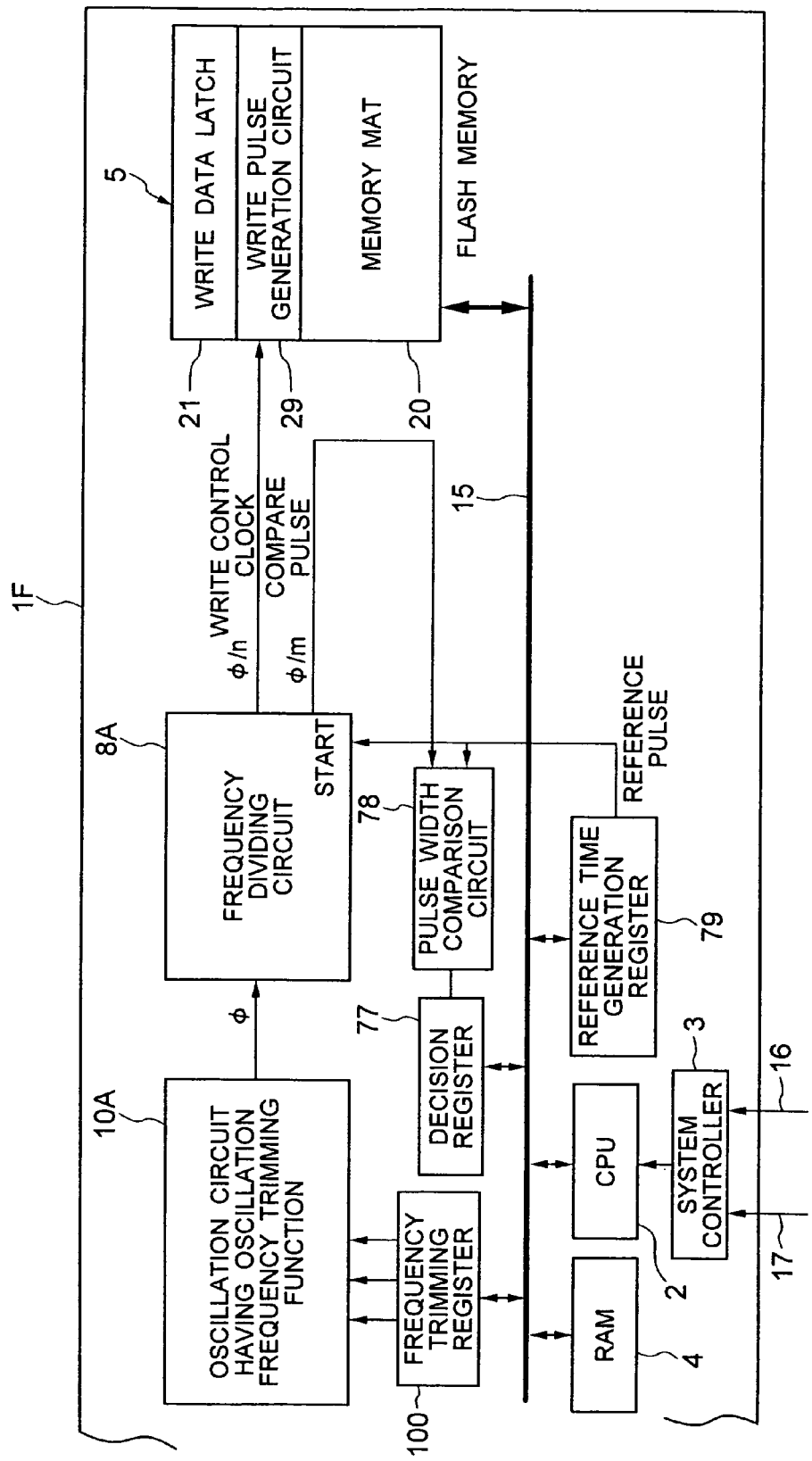
FIG. 24 is a block diagram showing a microcomputer as a modification of the arrangement shown in FIG. 18.

FIG. 24 shows a microcomputer 1F as a modification of the arrangement shown in FIG. 18. The difference of the arrangement shown in FIG. 24 from that shown in FIG. 18 resides in that an oscillation circuit 10A having an oscillation frequency trimming function is used and control data is set in a frequency trimming register 100. To enable frequency trimming, the circuit may be designed so as to be capable of changing the number of delay elements such as capacitive elements inserted in the oscillation loop of a ring oscillator or the amount of delay by the delay elements according to the value of control data in the trimming register 100.

<<Flash Memory Chip>>

Figure 25:
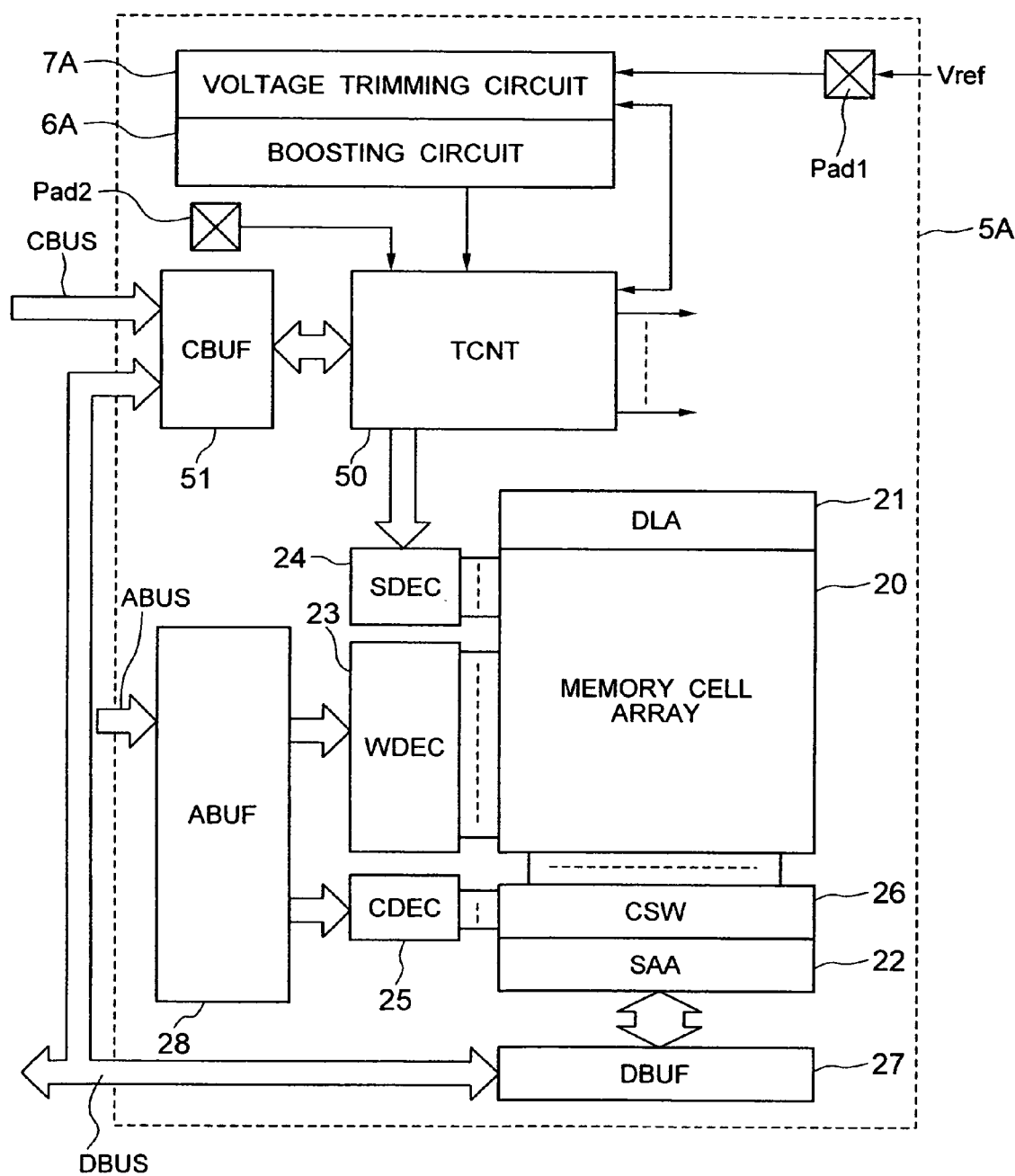
FIG. 25 is a block diagram showing a flash memory chip as an example of the semiconductor integrated circuit in accordance with the present invention.

FIG. 25 illustrates a flash memory chip 5A as an example of the semiconductor integrated circuit in accordance with the present invention. The flash memory chip 5A forms a discrete flash memory. Basically, the flash memory chip 5A has the same components as those shown in FIG. 2, i.e., memory cell array 20, DLA 21, SAA 22, WDEC 23, WEDEC 24, CDEC 25, CSW 26, DBUF 27, and ABUF 28. In FIG. 25, "ABUS" denotes an address bus, "DBUS" denotes a data bus, and "CBUS" denotes a control bus.

The flash memory chip 5A has a boosting circuit 6A and a trimming circuit 7A. The boosting circuit 6A generates a high voltage Vpp necessary for write and erase and supplies the high voltage Vpp to a timing controller (TCNT) 50. The trimming circuit 7A is a circuit for fine adjustment of the high Vpp. An electrode pad "Pad 1" such as a testing bonding pad for input of an expected voltage Vref used for trimming by the trimming circuit 7A is provided. An electrode pad "Pad 2" such as a testing bonding pad for designation of a test mode is also provided.

Information for control of ease and write operations from the data bus DBUS is set in the timing controller 50 through a control buffer (CBUF) 51. The timing controller is also supplied with bus commands, etc., from the control bus CBUS. That is, the timing controller 50 generates internal timing signals and operating voltages such as a write voltage and an erase voltage according to supplied control information and bus commands on the basis of control procedures for performing a read operation, an erase operation, a write operation, etc., and supplies the generated signal and voltages to the components of the flash memory. The operating voltages including the write voltage and erase voltage are generated by using the high voltage Vpp generated by the boosting circuit 6A.

Figure 26:
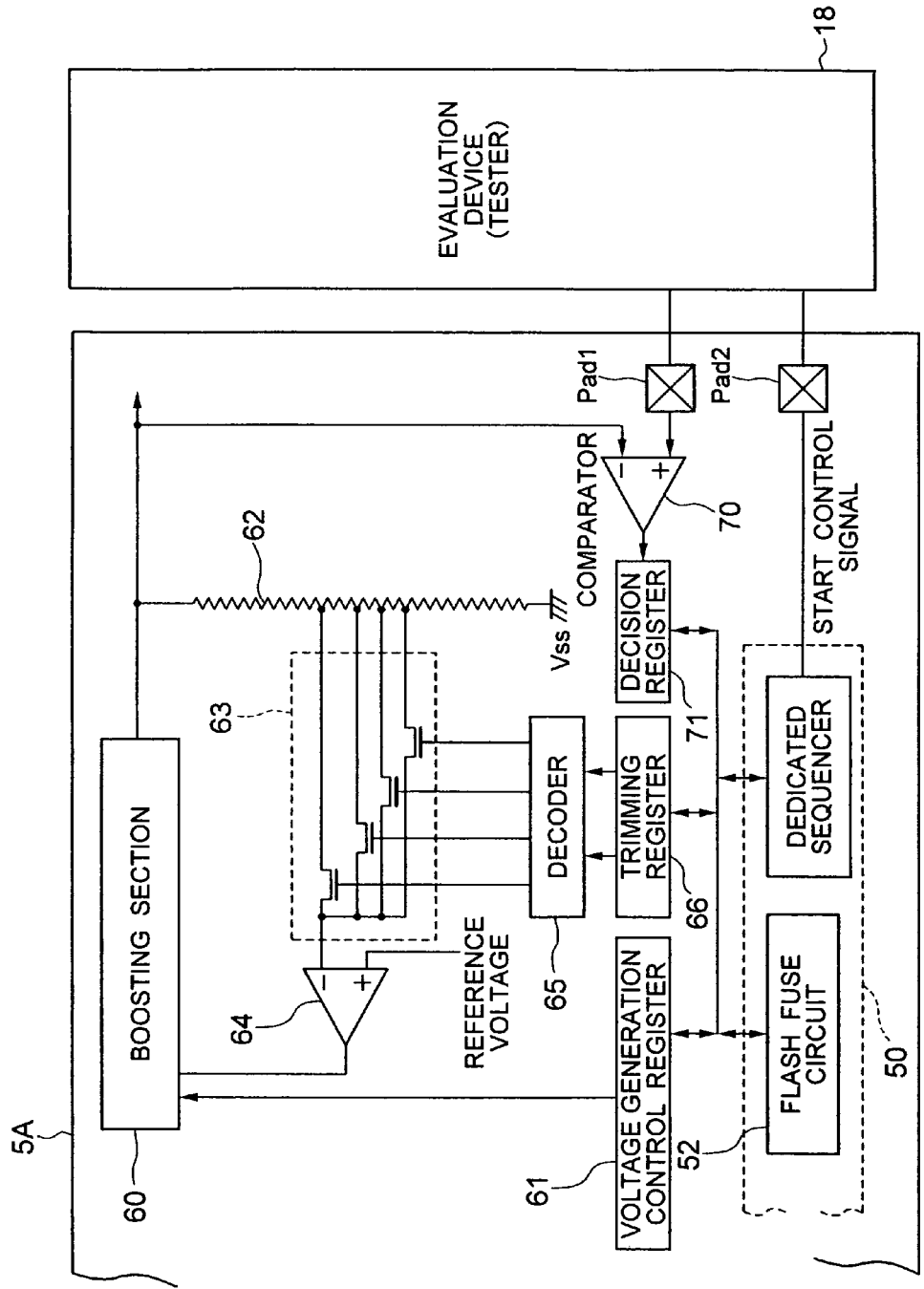
FIG. 26 is a block diagram showing a circuit configuration for voltage trimming.

FIG. 26 illustrates a circuit configuration for voltage trimming. The basic configurations of the trimming circuit 7A and the boosting circuit 6A are the same as those shown in FIG. 4. The circuit components having the same functions as those shown in FIG. 4 are indicated by the same reference characters and the detailed description for them will not be repeated. The difference from the configuration shown in FIG. 4 resides in that a specially-designed sequencer 76 and a flash fuse circuit 52 are provided in place of the CPU 2 shown in FIG. 4. The specially-designed sequencer 76 is specially designed to perform processing for realizing control circuit functions, i.e., determining control data on the trimming register 66 with reference to the value in the decision register 71, and storing the determined control data in the flash fuse circuit 52 by reading the data from the trimming register 66. For example, the specially-designed sequencer 76 is constituted by a hard wired logic. The specially-designed sequencer 76 and the flash fuse circuit 77 are incorporated in the timing controller 50. Processing with the specially-designed sequencer 76 is started, for example, in response to a test mode instruction provided via the electrode pad "Pad 2". The flash fuse circuit 52 is constituted by an electrically programmable nonvolatile memory elements such as flash memory cells. When a reset signal is input, for example, through the control bus CBUS, or when the power is turned on, control data stored in the flash fuse circuit 52 is initially loaded into the trimming register 66. Thereafter, the voltage trimming circuit 7A uses the initially loaded data to enable the high voltage Vpp adjusted according to the circuit characteristics in advance to be supplied to the timing controller 50.

Figure 27:
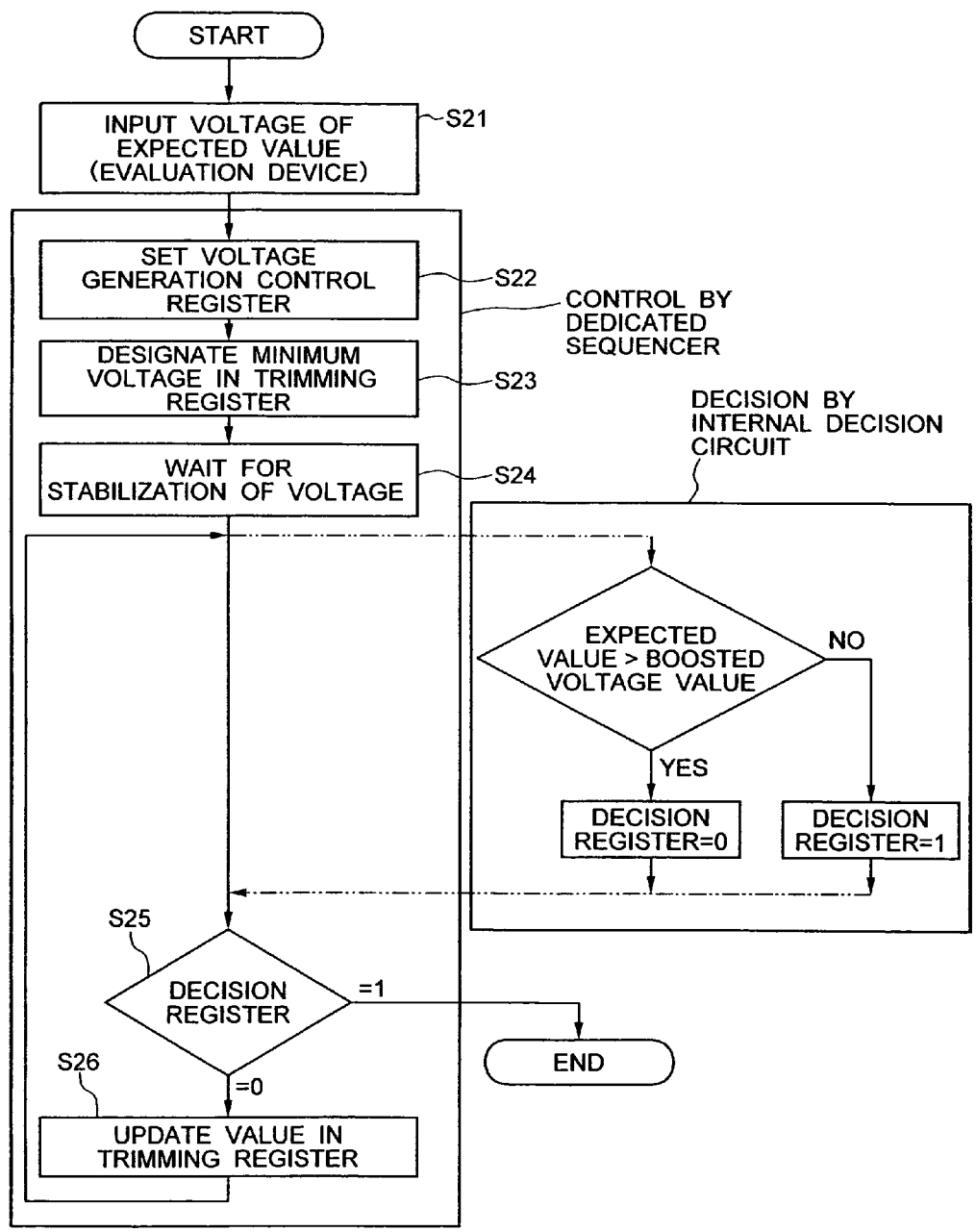
FIG. 27 is an overall flowchart of processing for obtaining trimming control data.

FIG. 27 is an overall flowchart of processing for obtaining trimming control data. The evaluation device 18 supplies an expected voltage Vref to the comparison circuit 70 via an electrode pad "Pad 1" such as a bonding pad (S21) to instruct the specially-designed sequencer 76 to start processing for trimming. The specially-designed sequencer 76 first sets operation start data in the voltage generation control register 61 (S22), and sets in the trimming register 66 control data designating a minimum voltage (S23). The specially-designed sequencer 76 waits for stabilization of the boosting operation of the boosting section 60 (S24). During this wait, the comparison circuit 70 compares the generated boosted voltage Vpp and the expected voltage Vref, sets "0" in the decision register 71 if Vref>Vpp, and sets "1" in the decision register 71 if Vref≦Vpp. The specially-designed sequencer 76 checks the value in the decision register 71 (S25) and, if the result is "0", designates the second highest voltage as boosted voltage Vpp by updating the control data in the trimming register 66, waits for stabilization of the boosting operation of the boosting section 60 (S26), and again performs the above-described decision step (S25). When "1" is determined in the decision step (S25), the process moves out of the decision processing loop to terminate processing for obtaining trimming control data. After obtaining the trimming control data, the specially-designed sequencer 76 writes the control data in the trimming register 66 to the flash fuse circuit 52.

Since the flash memory chip 1 has the trimming register 66, the comparison circuit 70, and the specially-designed sequencer 76, it can perform processing for obtaining trimming control data in a self-completion manner. Therefore, trimming processing in a plurality of the flash memory chips connected to the evaluation device 18 can be performed with efficiency by making the flash memory chips operate in parallel with each other.

Figure 28:
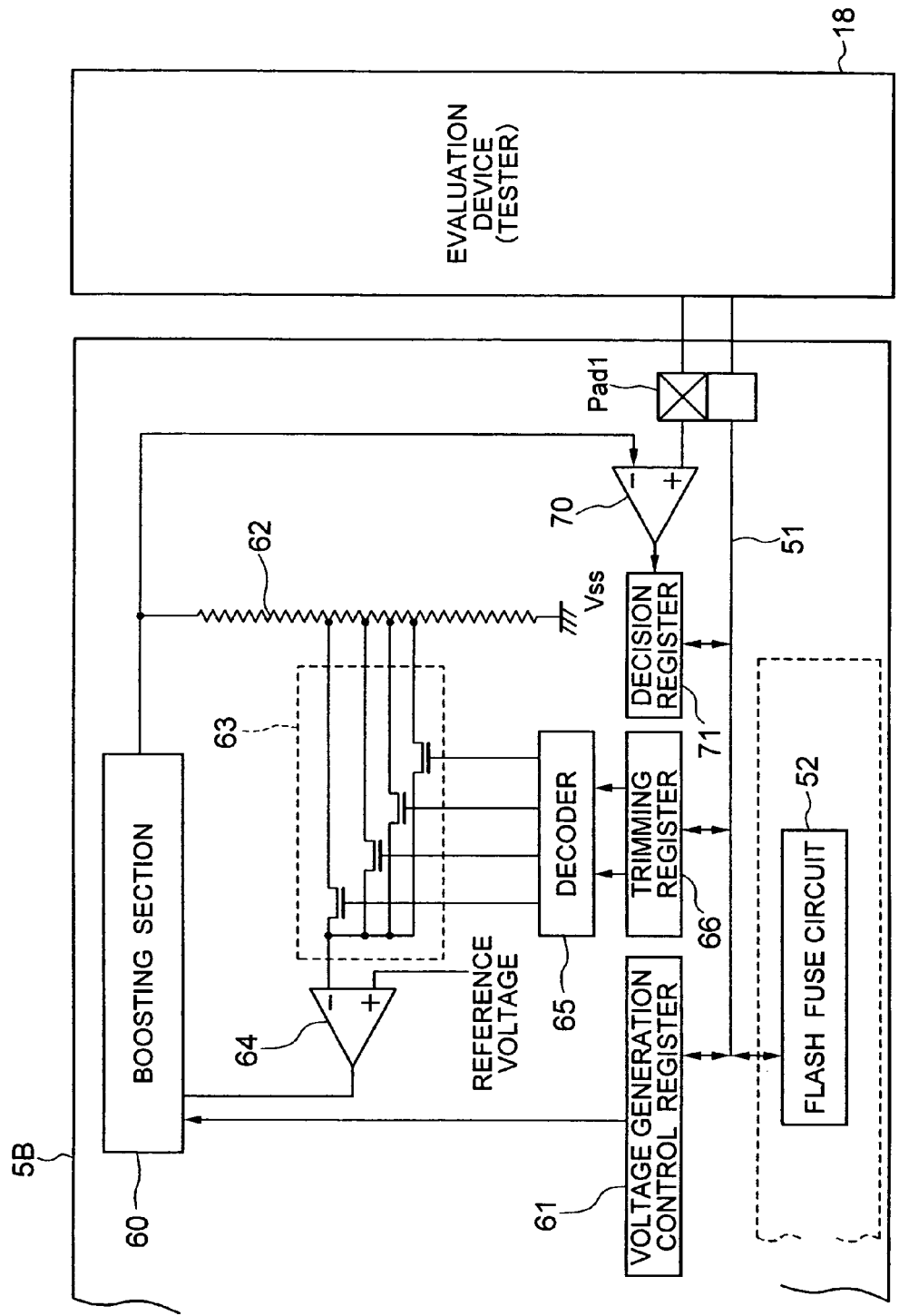
FIG. 28 is a block diagram showing a flash memory chip 5B as a modification of the arrangement shown in FIG. 26.
Figure 29:
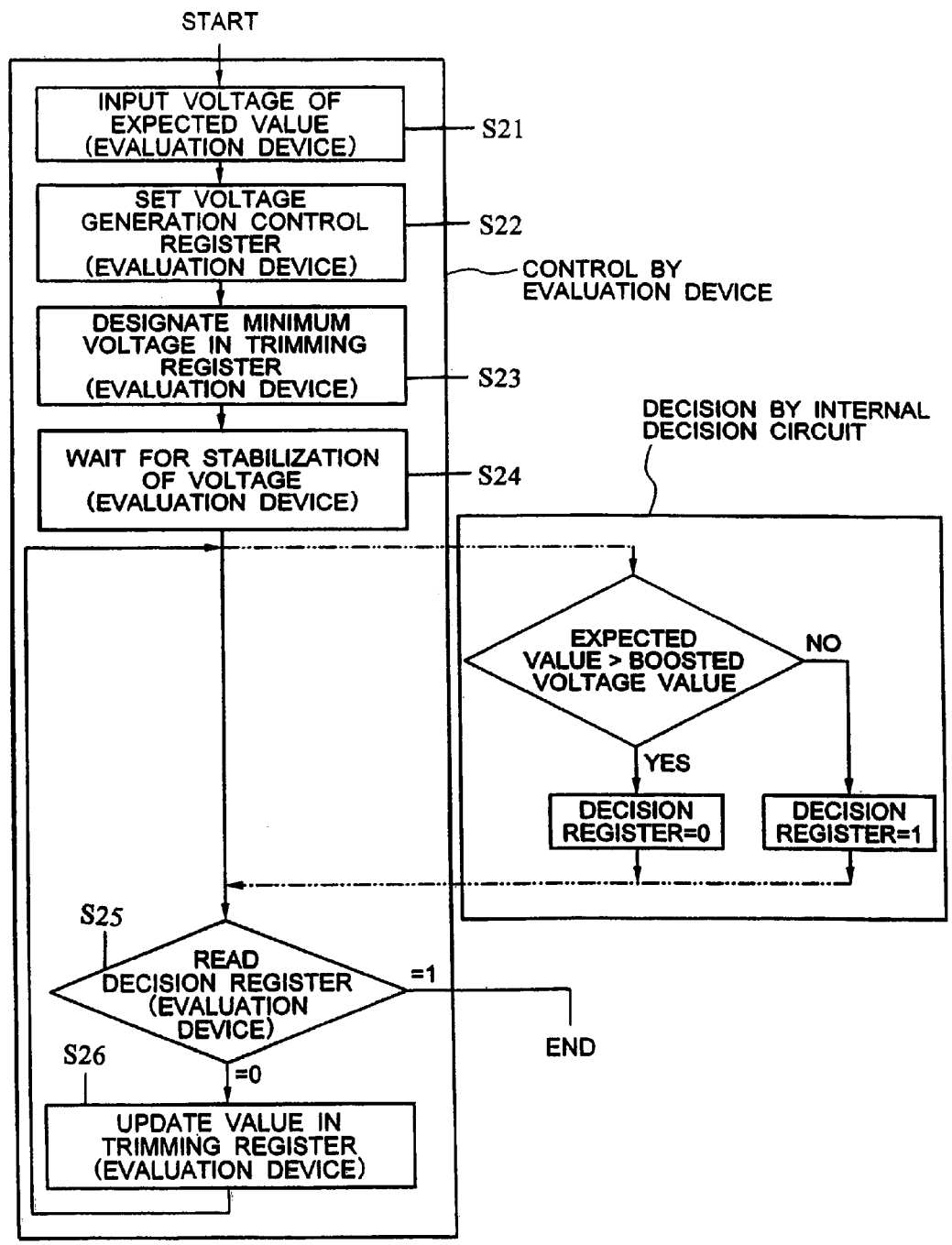
FIG. 29 is an overall flowchart of processing for obtaining trimming control data.

FIG. 28 shows a flash memory chip 5B as a modification of the arrangement shown in FIG. 26. The difference of the arrangement shown in FIG. 28 from that shown in FIG. 26 resides in that the specially-designed sequencer 76 is not provided. The voltage generation control register 61, the trimming register 66, the decision register 71, and the flash fuse circuit 52 are connected to the evaluation device 18 through an internal bus 51. The evaluation device 18 performs functions corresponding to those of the specially-designed sequencer 76. The entire process of obtaining trimming control data in this flash memory chip is as shown in the flowchart of FIG. 29.

The present invention has been described in detail with respect to the embodiments thereof. Needless to say, the invention is not limited to the described embodiments, and various modifications and changes in the embodiments may be made without departing from the spirit and scope of the invention.

For example, a nonvolatile memory for storing control data for boosted voltage trimming may be another nonvolatile storage means different from the nonvolatile memory in which a program and data are stored. For example, the nonvolatile storage means may be an electrically programmable electric fuse or an antifuse capable of electrical insulation breakdown may be used. The nonvolatile storage means is not limited to a so-called flash memory. It may be selected from other types of memory, e.g., ferroelectric memories. The kind of circuit selected as an object to be trimmed is not limited to a boosting circuit or a frequency dividing circuit. Trimming may also be performed on a bias circuit, etc. The nonvolatile storage element or nonvolatile storage means is not limited to those designed to store binary information. It may be a device for storing information of four or more values.

The effects obtained by typical arrangements of the present invention such as those disclosed in the specification of the present application are summarized below.

That is, a trimmed value which coincides with a voltage or a current of an expected value can be obtained by only supplying the expected voltage or current value externally and executing a predetermined trimming program by means of an internal CPU or the like. The same effect is also ensured with respect to trimming for adjustment of the frequency of a control clock for generating write and erase pulses. A voltage, a current or a pulse of an expected value externally provided can be supplied in common to a plurality of LSIs. Since a trimming program is executed by means of a control circuit such as an internal CPU, it can be executed in a plurality of LSIs in a parallel manner. Thus, parallel trimming can be performed on the plurality of LSIs with facility and the total test time can be reduced. Also, there is no need to provide a switching device such as a relay in an evaluation device.

Setting of control information for determining a voltage or a pulse width can be performed in a self-completion manner and can easily be performed in a parallel manner. It is also possible to correct the control information with facility.

It should be further understood by those skilled in the art that the foregoing description has been made on embodiments of the invention and that various changes and modifications may be made in the invention without departing from the spirit of the invention and the scope of the appended claims.

What is claimed is:

1. A processing circuit comprising:
   a central processing unit;
   a nonvolatile memory unit;
   a voltage generating unit; and
   a terminal,
   wherein said terminal receives a first voltage from outside of the processing circuit,
   wherein said central processing unit performs a first operation for checking a generating voltage generated by said voltage generating unit,
   wherein said nonvolatile memory unit has a plurality of nonvolatile memory cells and receives said generating voltage for storing data to ones of said nonvolatile memory cells, and
   wherein in performing said first operation by said central processing unit, said central processing unit executes operations for comparing said first voltage with said generating voltage and for adjusting said generating voltage in accordance with a result of the comparing.

2. A processing circuit according to claim 1, further comprising a register unit,
   wherein said register unit stores a value indicating voltage level of said generating voltage, and
   wherein in performing said first operation, said central processing unit changes said value stored in said register unit for adjusting said generating voltage.

3. A processing circuit according to claim 2,
   wherein said central processing unit stores said value stored in said register unit to ones of said nonvolatile memory cells of said nonvolatile memory unit after adjusting said generating voltage.

4. A processing circuit according to claim 3, further comprising a random access memory,
   wherein program steps of said first operation are stored into said random access memory, and
   wherein said central processing unit fetches each of said program steps of said first operation from said random access memory.

5. A testing system having a tester unit coupled with one or more said processing circuits according to claim 4,
   wherein said tester unit supplies said first voltage as a reference voltage to each said processing circuit via said terminal thereof.

6. A testing system according to claim 5,
   wherein said tester unit supplies said program steps of said first operation to each said processing circuit for storing to said random access memory thereof and for execution by said central processing unit thereof.

7. A testing system according to claim 5,
   wherein said tester unit is coupled to a plurality of said processing circuits and said reference voltage is supplied to said processing circuits in parallel.

* * * * *